United States Patent
Hashimoto et al.

(10) Patent No.: US 6,635,495 B2
(45) Date of Patent: Oct. 21, 2003

(54) INFRARED DETECTING ELEMENT, INFRARED TWO-DIMENSIONAL IMAGE SENSOR, AND METHOD OF MANUFACTURING THE SAME

(75) Inventors: Kazuhiko Hashimoto, Kadoma (JP); Tomonori Mukaigawa, Tokyo (JP); Ryuichi Kubo, Nagaokakyo (JP); Hiroyuki Kishihara, Kyoto (JP); Minoru Noda, Suita (JP); Masanori Okuyama, 16-13, Uenosaka 1-chome, Toyonaka-shi, Osaka (JP)

(73) Assignees: Matsushita Electric Industrial Co., Ltd., Kadoma (JP); Hochiki Corporation, Tokyo (JP); Murata Manufacturing Co., Ltd., Nagaokakyo (JP); Masanori Okuyama, Toyonaka (JP)

( * ) Notice: Subject to any disclaimer, the term of this patent is extended or adjusted under 35 U.S.C. 154(b) by 0 days.

(21) Appl. No.: 09/866,881

(22) Filed: May 30, 2001

(65) Prior Publication Data

US 2002/0005485 A1 Jan. 17, 2002

(30) Foreign Application Priority Data

Jun. 1, 2000 (JP) ........................................ 2000-164689

(51) Int. Cl.⁷ ........................... H01L 21/00; H01L 37/00
(52) U.S. Cl. .......................... 438/3; 438/54; 250/338.2
(58) Field of Search ............................. 438/3, 53, 52, 438/54; 250/338.2, 338.3, 338.4

(56) References Cited

U.S. PATENT DOCUMENTS

| | | | | |
|---|---|---|---|---|
| 5,079,420 A | * | 1/1992 | Turnbull | 250/338.3 |
| 5,523,564 A | * | 6/1996 | Yamada et al. | 250/338.1 |
| 5,684,302 A | * | 11/1997 | Wersing et al. | 250/338.3 |
| 5,850,098 A | * | 12/1998 | Butler et al. | 257/467 |
| 5,949,071 A | * | 9/1999 | Ruffner et al. | 250/338.3 |
| 5,990,481 A | * | 11/1999 | Beratan | 11/99 |

FOREIGN PATENT DOCUMENTS

JP 08292101 A * 11/1996

OTHER PUBLICATIONS

Jerominek, H., et al., Micromachined, Uncooled, $VO_2$–based, IR Bolometer Arrays; SPIE vol. 2746, Quebec, Canada,; pp. 60–71.

"Pyroelectric Imaging", Bernard M. Kulwicki et al., Proc. $8^{th}$ IEEE Int. Symp. Appl. Ferroelectrics 1992, pp, 1–10.

* cited by examiner

*Primary Examiner*—John F. Niebling
*Assistant Examiner*—Viktor Simkovic
(74) *Attorney, Agent, or Firm*—Armstrong, Westerman & Hattori, LLP

(57) ABSTRACT

An infrared detecting capacitor formed of a ferroelectric film has its capacitor portion supported by first and second interconnecting lines to be held on an Si substrate located on both sides of a trench. A lower electrode is coupled with the first interconnecting line while an upper electrode is coupled with the second interconnecting line. The capacitor portion is a rectangle in shape in plan view without small triangular sections opposite to each other in the diagonal direction.

8 Claims, 28 Drawing Sheets

Si SUBSTRATE 300

METAL FILM 308
SiO2 304

METAL FILM 308
FERROELECTRIC FILM 310
SiO2 304

Si SUBSTRATE 300

SiO₂ 304

SiO₂ 304

332

Si SUBSTRATE 300

MgO FILM 305
SiO2 304

MgO FILM 305
SiO2 304

INFRARED DETECTING ELEMENT, INFRARED TWO-DIMENSIONAL IMAGE SENSOR, AND METHOD OF MANUFACTURING THE SAME

BACKGROUND OF THE INVENTION

1. Field of the Invention

The present invention relates to a structure and a manufacturing method of an infrared detecting element using ferroelectric thin film material to detect the intensity of infrared radiation from an object.

2. Description of the Background Art

[Background Art of Infrared Detecting Element]

Objects and human bodies at room temperature radiate infrared rays (heat rays) of approximately 10 μm in wavelength which can be measured to detect the presence of them and obtain temperature information without contact. This infrared detection is applied to various uses like automatic door, intruder alarm, cooking monitor of microwave oven, chemical measurement, and the like.

The key device of prime importance for such measurement is an infrared sensor. There are generally two types of infrared sensors, i.e., quantum infrared sensor and thermal infrared sensor.

The quantum infrared sensor is highly sensitive and excellent in sensing ability while it requires cooling resulting in increase in size of the entire device and thus has a problem in practical use. On the other hand, the thermal infrared sensor is somewhat inferior to the quantum infrared sensor in terms of sensitivity while it is appropriate for practical use because of its advantage that operation at room temperature is possible.

Ferroelectric materials have temperature dependencies of both of polarization and dielectric constant as shown in FIG. 26, and these characteristics are applicable to thermal infrared sensors. The former effect is related to conventional pyroelectric (PE) bolometers and the latter effect is related to dielectric bolometers (DB).

Accordingly, various thermal infrared sensors have been proposed including those utilizing pyroelectric effect, resistance bolometer, dielectric bolometer, thermopile, Golay cell, and the like. For example, an infrared image sensor using the pyroelectric effect is disclosed in Proc. 8th IEEE Int. Symp. Appl. Ferroelectronics (1992), pp. 1–10 ("PYROELECTRIC IMAGING" by Bernard M. Kulwicki et al.).

In particular, the dielectric bolometer which applies electric field to detect the change of dielectric constant with respect to temperature has a higher sensitivity than those of other sensors and it requires no chopper. Because of these excellent features, the dielectric bolometers are considered prospective in terms of practical use.

Further, an advanced infrared sensing is expected that is applied to infrared image sensors (thermography) capable of providing temperature distribution of objects and scenery without contact.

In order to accomplish infrared imaging, infrared image pickup devices operating at room temperature have been produced as prototypes by bump-coupling an array of pyroelectric ceramic and a silicon FET (field effect transistor) or forming a thin-film and low-resistive bolometer on a microbridge structure which is coupled with a silicon FET array.

Regarding these devices, a higher performance is expected such as an enhanced resolution by increase in sensitivity and number of pixels and the like. However, conventional pyroelectric infrared sensors and infrared sensors in the form of resistance bolometers are limited in sensitivity or have an insufficient number of pixels.

FIG. 27 shows a cross sectional structure of a conventional pixel cell 20 in such an infrared detecting element coupled with a silicon FET array.

Referring to FIG. 27, pixel cell 20 includes a silicon oxide film 304 deposited on an Si substrate 300, a MOS transistor Tr1 formed in an opening of silicon oxide film 304, an infrared detecting capacitor CF formed being adjacent to MOS transistor Tr1 and constituted of a lower electrode 308 (stacked Pt/Ti films), a ferroelectric film 310 (BST film) and an upper electrode 312 (Al film), and a trench 330 opened to extend from the rear side of Si substrate 300 to a predetermined depth directly below infrared detecting capacitor CF.

MOS transistor Tr1 includes source/drain regions 320 and 324 formed in a main surface of the Si substrate in the opening of silicon oxide film 304 that are impurity regions of opposite polarity to that of the substrate, a channel layer 322 formed in the main surface of the Si substrate between source/drain regions 320 and 324, a gate oxide film 302 deposited on the main surface of the Si substrate directly above the channel layer, and a polysilicon gate electrode 314 formed on gate oxide film 302.

Lower electrode 308 is deposited on a silicon nitride film 306 which is deposited on silicon oxide film 304 to serve as an interlayer insulating film. Lower electrode 308 contacts source/drain region 320.

On gate electrode 314, an interconnecting line 316 is provided that is formed of the same interconnection layer as lower electrode 308, an interconnecting line 318 formed of the same interconnection layer as lower electrode 308 contacts source/drain region 324.

Trench 330 is provided in order to reduce thermal loss as much as possible to Si substrate 300 having a high thermal conductivity since pixel cell 20 is a thermal infrared sensor and a rise in temperature of the cell directly affects the intensity of an output signal.

Accordingly, it is desirable in terms of process to make the thickness of Si substrate as thin as possible that remains between trench 330 and silicon oxide film 304. On the other hand, since it is not preferable that the thickness of remaining Si substrate differs between pixel cells 20, an etching stopper layer is formed on the front side of the Si substrate when trench 330 is formed by etching from the rear side. For example, the etching stopper layer can be generated by implanting ions (e.g. at least $3 \times 10^{16}$ cm$^{-3}$ in concentration) like boron (B) from the front side of the substrate to reduce the etching rate of Si.

A method of manufacturing pixel cell 20 shown in FIG. 27 is explained below in conjunction with respective cross sections showing the first to twelfth steps of the method.

FIGS. 28 to 39 are cross sectional views respectively illustrating the first to twelfth steps.

Referring to FIG. 28, on the surface of Si substrate 300 which has been RCA-cleaned, silicon oxide film 304 is formed through thermal oxidation in the first step.

The thermal oxidation is performed under the conditions, for example, that oxidation at 1000° C. and 5l/min of oxygen flow rate for 5 minutes is performed and thereafter oxidation at 1000° C., 5l/min of oxygen flow rate and 4.5l/min of hydrogen flow rate for 180 minutes is performed. The thermal oxidation under these conditions forms an about 650-nm-thick oxide film for example.

Further, an alignment mark 301 is formed on the rear side of the substrate by anisotropic dry etching or the like.

Referring to FIG. 29, in the second step, an opening is formed in a predetermined region 303 of silicon oxide film 304 by etching. MOS transistor Tr1 is formed in this region 303 as described later.

Referring to FIG. 30, a resist pattern 305 is used as a mask for ion implantation of ion species into channel portion 322 of MOS transistor Tr1, the ion species corresponding to the conductivity type of the channel portion 322. Then, annealing is performed for activation.

Referring to FIG. 31, gate oxide film 302 is deposited on the Si substrate through thermal oxidation and thereafter a polysilicon 307 is deposited by CVD (Chemical Vapor Deposition) or the like that forms the gate electrode.

Referring to FIG. 32, polysilicon 307 is patterned and etched by anisotropic etching like RIE (Reactive Ion etching) to form gate electrode 314.

Referring to FIG. 33, the gate pattern is used as a mask to etch away gate oxide film 302 on opening 303 and silicon oxide film 304, and then gate electrode 314 and silicon oxide film 304 are used as a mask to diffuse impurities to generate source/drain regions 320 and 324.

Referring to FIG. 34, silicon nitride film 306 is deposited by CVD or the like.

Silicon nitride film 306 is formed under the conditions for example of 780° C., 0.015 l/min of $SiC_{12}H_2$, 0.060 l/min of $NH_3$, 26.7 Pa and 60 minutes so that a silicon nitride film of approximately 300 nm is deposited.

Referring to FIG. 35, the rear side of the wafer is patterned by means of resist to etch away the silicon nitride film and the silicon oxide film. Then, trench 330 is formed directly below infrared detecting capacitor CF in Si substrate 300 by anisotropic wet etching from the rear side of the substrate under the conditions of etchant of TMAH 22%, 100° C. and 180 minutes. The size of opening of the trench is for example several tens of $\mu$m×several tens of $\mu$m. The depth of etching is approximately 250 $\mu$m.

The thickness of the Si substrate directly below infrared detecting capacitor CF is in the range of 0 to 50 $\mu$m for example, preferably as thin as possible to the extent that the mechanical strength is secured as discussed above.

In other words, preferably the Si substrate is etched away directly under infrared detecting capacitor CF so that no Si substrate is present.

Referring to FIG. 36, a contact hole (connection hole) is formed by RIE or the like that opens on source/drain regions 320 and 324 of MOS transistor Tr1 and on gate electrode 314.

Referring to FIG. 37, stacked Pt/Ti films are formed that constitute lower electrode 308 and interconnecting lines 316 and 318 by means of lift-off technique or the like including patterning by resist, film deposition by sputtering or vacuum evaporation, and acetone and ultrasonic cleaning. When the film deposition is performed by RF sputtering, the Ti film is formed by the sputtering under the conditions of 0.00532 l/min of Ar, 0.6 Pa and RF power of 500 W for 3 minutes and the Pt film is formed by the sputtering under the conditions of 0.00532 l/min of Ar, 0.6 Pa, RF power of 200 W for 8 minutes. Following these conditions, the Ti film of 60 nm and the Pt film of 160 nm in thickness are generated.

Referring to FIG. 38, a BST film or the like is deposited for ferroelectric film 310 by laser ablation method or the like. The laser ablation enables the ferroelectric film to be deposited at a low substrate temperature so that the substrate where an FET array is formed is less damaged.

Referring to FIG. 39, Al film 312 is formed by sputtering, vacuum evaporation or the like into a predetermined pattern to constitute the upper electrode.

Pixel cell 20 having the cross sectional structure as shown in FIG. 27 is thus produced through these steps.

Pixel cell 20 shown in FIG. 27 is a dielectric bolometer utilizing field-induced pyroelectric effect. The bolometer operates as an infrared sensor by using change of the dielectric constant with temperature.

As described above, the thickness of the Si substrate directly below infrared detecting capacitor CF is desirably 0 $\mu$m.

In order to achieve this, after the step shown in FIG. 39, the Si substrate is dry-etched from the rear side of the wafer using the silicon nitride and oxide films as a mask. The etching may be performed under the conditions of 0.0075 l/min of $SF_6$ gas, 13.3 Pa and RF power of 50 W for approximately 30 minutes.

A problem as explained below arises when trench 330 is formed by etching of the Si substrate from the rear side to the front surface thereof.

FIG. 40 is a plan view illustrating a state resultant from complete etching of the Si substrate immediately below infrared detecting capacitor CF so that the thickness of the Si substrate becomes 0 $\mu$m. FIG. 41 is a cross section along XLI—XLI in FIG. 40

As shown, a portion is held on the trench after the etching leaving no Si substrate directly under infrared detecting capacitor CF. That portion is called "membrane" and such a structure is referred to as "membrane structure."

A problem of this membrane structure is distortion of the membrane as shown in FIG. 41 resultant from influence of film stress and the like caused by the multilayer structure of infrared detecting capacitor CF consisting of the underlying insulating film, lower electrode, ferroelectric thin film, upper electrode and the like.

The film stress may be alleviated by forming films with respective stresses in reverse directions into the multilayer structure. However, in order to stack films so that respective stresses are cancelled with respect to each other, precise management and control of the film thickness and stress value are necessary for each layer of the stacked films, which complicate the process in vain.

Moreover, a considerable time is required for etching the Si substrate from the rear side to form trench 330 so that etchant could deteriorate characteristics of the ferroelectric thin film.

SUMMARY OF THE INVENTION

One object of the present invention is to provide an infrared two-dimensional image sensor which can be integrated easily and enhanced in detecting sensitivity.

In summary, according to an aspect, the present invention is an infrared detecting element formed on a main surface of a substrate that includes an infrared detecting capacitor having a capacitance value changing according to temperature change caused by absorption of infrared radiation. The infrared detecting capacitor includes a trench formed in the substrate, first and second interconnecting lines extending from both sides of the trench, and a capacitor portion. The capacitor portion is shaped to have three pairs of opposing sides in plan view, one pair of opposing vertex parts of the capacitor portion supported by the first and second interconnecting lines to be held on the trench. The capacitor portion includes an upper electrode coupled to the first interconnecting line, a lower electrode opposing the upper electrode and coupled to the second interconnecting line, and a ferroelectric thin film provided between the upper and lower electrodes. The infrared detecting element detects the change of the capacitance value of the infrared detecting capacitor to sense infrared radiation.

According to another aspect of the present invention, an infrared two-dimensional image sensor includes a plurality of pixel cells arranged in a form of matrix. The pixel cells each include an infrared detecting capacitor having a capacitance value changing according to temperature change caused by absorption of infrared radiation. The infrared detecting capacitor includes a trench formed in the substrate, first and second interconnecting lines extending from both sides of the trench, and a capacitor portion shaped to have three pairs of opposing sides in plan view, one pair of opposing vertex parts of the capacitor portion supported by the first and second interconnecting lines to be held on the trench. The capacitor portion includes an upper electrode coupled to the first interconnecting line, a lower electrode opposing the upper electrode and coupled to the second interconnecting line, and a ferroelectric thin film provided between the upper and lower electrodes. The change of the capacitance value of the infrared detecting capacitor is detected to sense infrared radiation.

According to still another aspect of the present invention, a method of manufacturing an infrared detecting element includes the steps of: forming on a main surface of a substrate a first interconnecting line and a lower electrode metal layer; forming a ferroelectric layer on the lower electrode metal layer; depositing a first insulating film on the ferroelectric layer; forming on the first insulating film an upper electrode metal layer and a second interconnecting line; anisotropically wet etching the substrate beneath the lower electrode metal layer from the main surface of the substrate to form a trench such that the lower electrode metal layer, the ferroelectric layer and the upper electrode metal layer are supported by the first and second interconnecting lines.

According to a further aspect of the present invention, a method of manufacturing an infrared detecting element includes the steps of: forming an MgO film on a main surface of a substrate; forming on the MgO film a first interconnecting line and a lower electrode metal layer; forming a ferroelectric layer on the lower electrode metal layer; forming on the ferroelectric layer an upper electrode metal layer and a second interconnecting line; and anisotropically wet etching the substrate beneath the lower electrode metal layer from the main surface of the substrate to form a trench such that the lower electrode metal layer, the ferroelectric layer and the upper electrode metal layer are supported by the first and second interconnecting lines.

According to a still further aspect of the present invention, a method of manufacturing an infrared detecting element includes the steps of: depositing a first insulating film on a main surface of a substrate and patterning the first insulating film into a shape including a predetermined shape in plan view; anisotropically wet etching the substrate beneath the predetermined shape of the first insulating film from the main surface of the substrate to form a trench such that the predetermined shape constitutes a membrane supported with respect to the main surface of the substrate; forming a first interconnecting line and a lower electrode metal layer for the membrane; forming a ferroelectric layer on the lower electrode metal layer; depositing a second insulating film on the ferroelectric layer; and forming on the second insulating film an upper electrode metal layer and a second interconnecting line.

According to a still further aspect of the present invention, a method of manufacturing an infrared detecting element includes the steps of: depositing a first insulating film on a main surface of a substrate; forming an MgO film on the first insulating film and patterning the first insulating film and the MgO film into a shape including a predetermined shape in plan view; anisotropically wet etching the substrate beneath the predetermined shape of the first insulating film from the main surface of the substrate to form a trench such that the predetermined shape constitutes a membrane supported with respect to the main surface of the substrate; forming a first interconnecting line and a lower electrode metal layer on the membrane; forming a ferroelectric layer on the lower electrode metal layer; and forming on the ferroelectric layer an upper electrode metal layer and a second interconnecting line.

Pixel cells having the infrared detecting elements according to the present invention can be used to achieve an infrared detecting circuit of a simple structure having a high sensitivity at room temperature. A two-dimensional sensor array having such pixel cells arranged in two dimension can be used to achieve an infrared two dimensional image sensor operating at room temperature with a high sensitivity and highly dense pixels.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view showing a plane pattern where the circuit shown in FIG. 2 is formed as an integrated circuit on a semiconductor substrate of silicon (Si) or the like.

DESCRIPTION OF THE PREFERRED EMBODIMENTS

Embodiments of the present invention are hereinafter described in conjunction with the drawings.

[First Embodiment]

Figure 1:
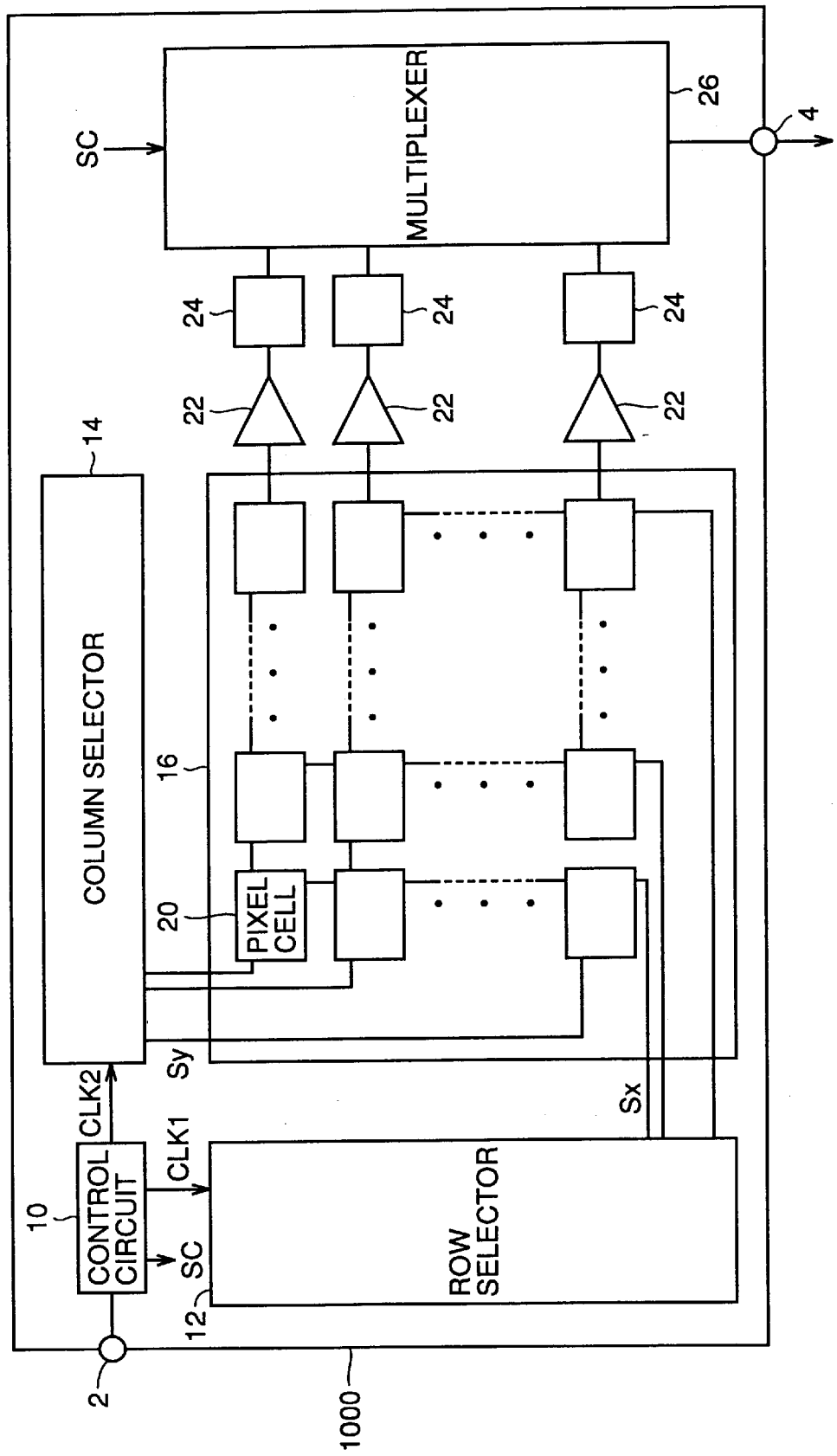
FIG. 1 is a schematic block diagram showing a structure of an infrared two-dimensional image sensor 1000 according to a first embodiment of the present invention.

FIG. 1 is a schematic block diagram showing a structure of an infrared two-dimensional image sensor 1000 according to a first embodiment of the present invention.

Infrared two-dimensional image sensor 1000 includes a control signal input terminal 2 receiving an external control signal (including timing signal, address signal and the like), a control circuit 10 according to the external control signal to control the operation of infrared two-dimensional image sensor 1000, a sensor array 16 having pixel cells 20 arranged in the form of a matrix, a row selector 12 controlled by control circuit 10 to select a row in sensor array 16, a column selector 14 controlled by control circuit 10 to select a column in sensor array 16, an operational amplifier 22 provided corresponding to a column of sensor array 16 to amplify a signal from a selected pixel cell, a bandpass filter 24 provided corresponding to a column of sensor array 16 to eliminate high-frequency noise of a signal from operational amplifier 22, and a multiplexer 26 controlled by control circuit 10 to selectively supply a signal from bandpass filter 24 to an output terminal 4.

Control circuit 10 outputs, in response to the external control signal, a signal CLK1 for controlling the operation of row selector 12, a signal CLK2 for controlling the operation of column selector 14 and a signal SC for controlling the operation of multiplexer 26.

Figure 2:
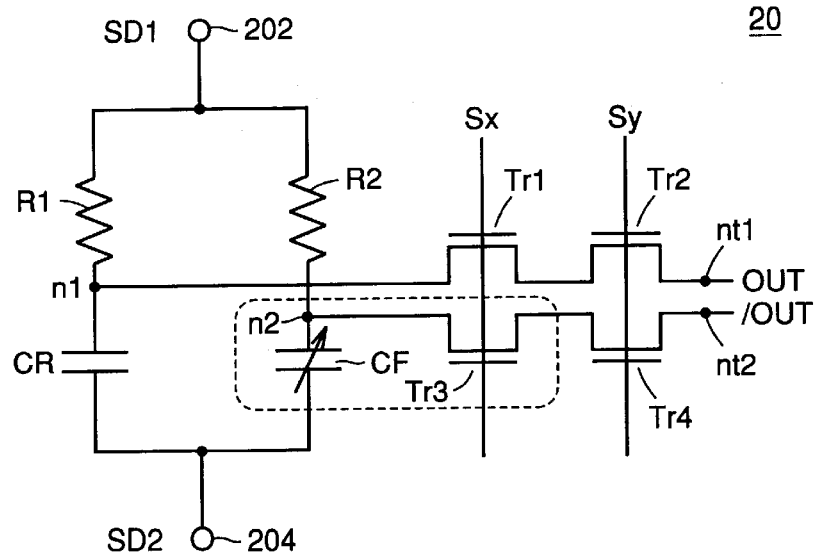
FIG. 2 is a circuit diagram showing a structure of a pixel cell 20 in FIG. 1.

FIG. 2 is a circuit diagram showing a structure of pixel cell 20 in FIG. 1.

Pixel cell 20 includes a node 202 receiving a first drive signal SD1, a node 204 receiving a second drive signal SD2, a resistor R1 and a reference capacitor CR connected in series between nodes 202 and 204, a resistor R2 and an infrared detecting capacitor CF connected in series between nodes 202 and 204, transistors Tr1 and Tr2 connected in series between a connection node n1 of resistor R1 and reference capacitor CR and a first output node nt1 of pixel cell 20, and transistors Tr3 and Tr4 connected in series between a connection node n2 of resistor R2 and infrared detecting capacitor CF and a second output node nt2 of pixel cell 20.

Transistors Tr1 and Tr3 are rendered conductive or nonconductive according to a signal Sx from row selector 12, and transistors Tr2 and Tr4 are rendered conductive or nonconductive according to a signal Sy from column selector 14.

Output nodes nt1 and nt2 supply respective signals OUT and /OUT that are complementary to each other.

An implanted resistor or polysilicon thin film may be used as resistors R1 and R2, for example. The resistors are not particularly restricted to them and a thin film of other metal materials or the like may be employed as resistors R1 and R2.

As the reference capacitor, a capacitor using a ferroelectric thin film similar to that of the infrared detecting capacitor that is shielded from infrared radiation, or a structure consisting of metal electrodes and a silicon oxide film provided therebetween may be used, however, these are not restrictions.

As the infrared detecting capacitor, a thin film of ferroelectric material, for example, $(Ba_{1-x}Sr_x) TiO_3$ (hereinafter referred to as BST) may preferably be used. It is noted that the infrared detecting capacitor is not particularly limited to BST and may be of any material having its dielectric constant varying with change of temperature caused by absorption of infrared radiation.

Here, the infrared detecting sensitivity is several tens of times that achieved by the conventional device using a pure pyroelectric effect without field application, and approximately five times that of the resistance bolometer. A further advantage is that no chopper is necessary since the dielectric constant is measured by applying electric field.

Moreover, a relatively simple structure can be used to dramatically enhance the sensitivity by taking a difference relative to the reference capacitor. Accordingly, a high resolution can readily be obtained even with a two-dimensional array.

Figure 3:
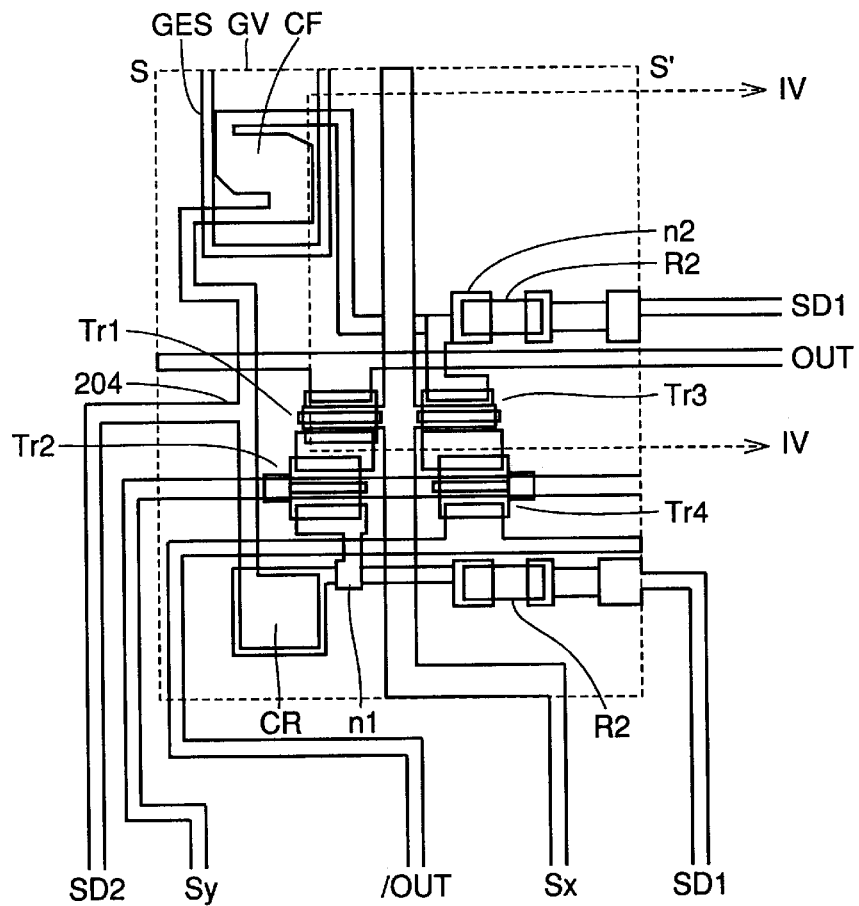
Figure 4:
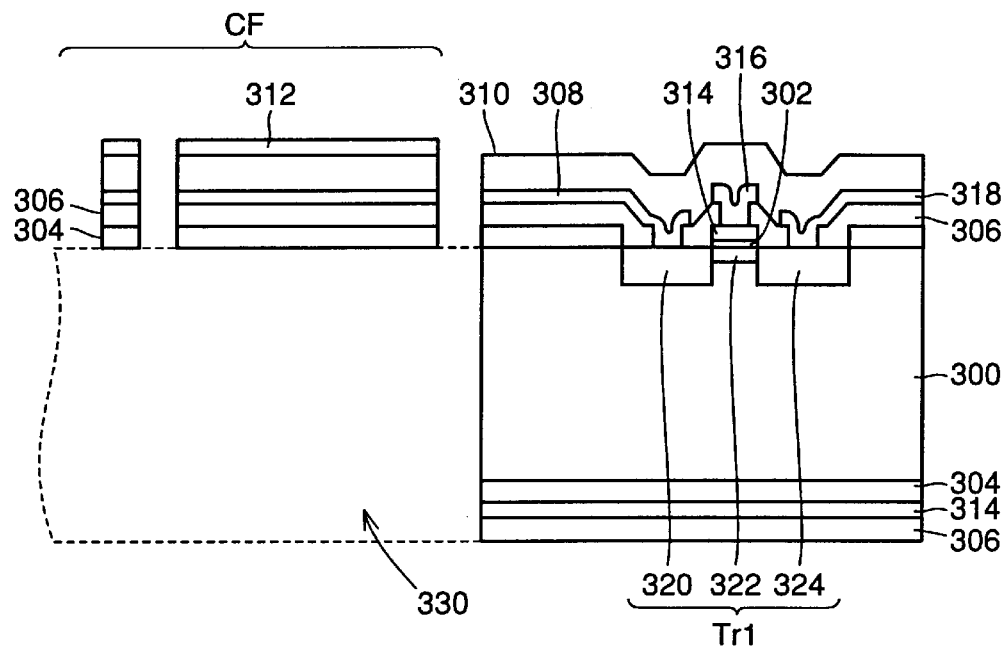
FIG. 4 is a cross sectional view along IV—IV in FIG. 3.

FIG. 3 is a plan view showing a plane pattern where the circuit shown in FIG. 2 is formed as an integrated circuit on a semiconductor substrate of silicon (Si) or the like. FIG. 4 is a cross sectional view along IV—IV in FIG. 3.

Figure 27:
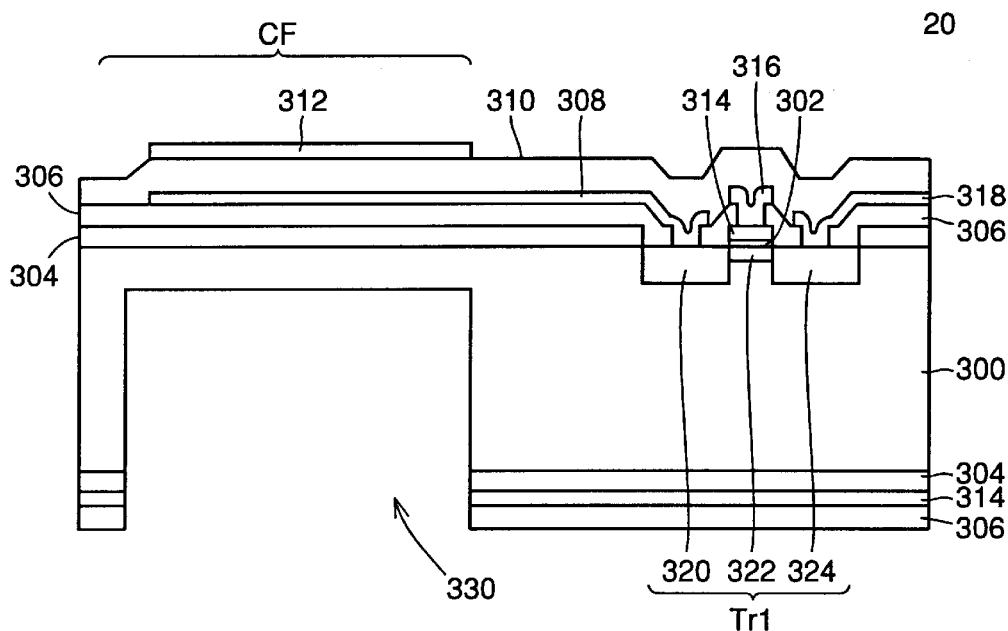
FIG. 27 shows a cross sectional structure of a conventional pixel cell 20 in an infrared detecting element coupled with a silicon FET array.
Figure 28:
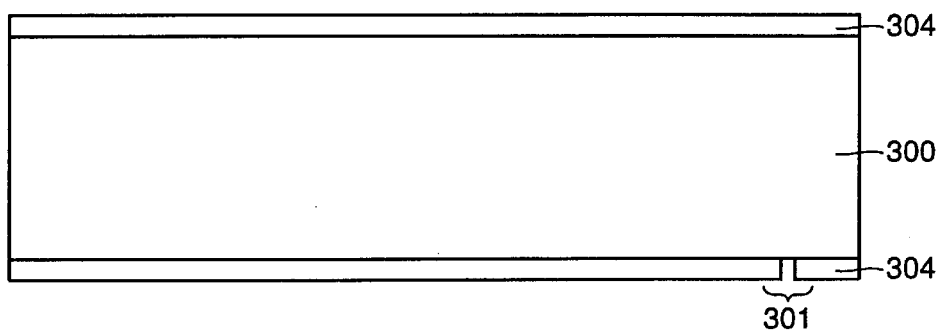
FIGS. 28 to 39 are cross sectional views respectively illustrating the first to twelfth steps in a manufacturing flow of the conventional pixel cell 20.
Figure 29:
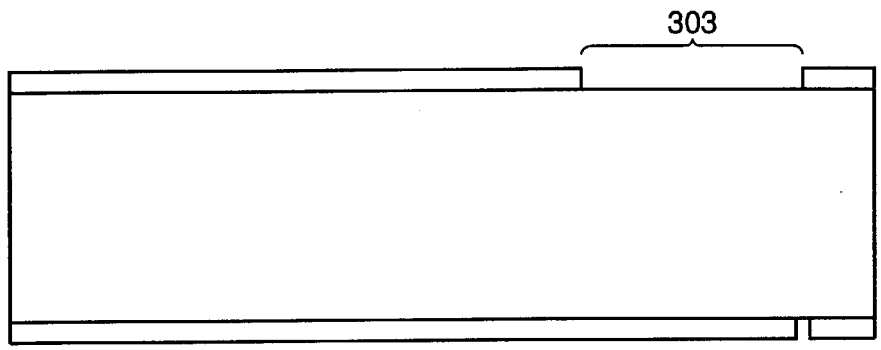
Figure 30:
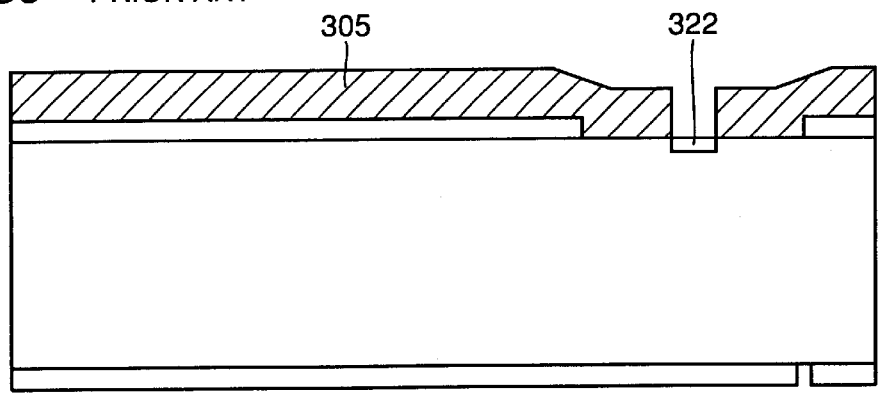
Figure 31:
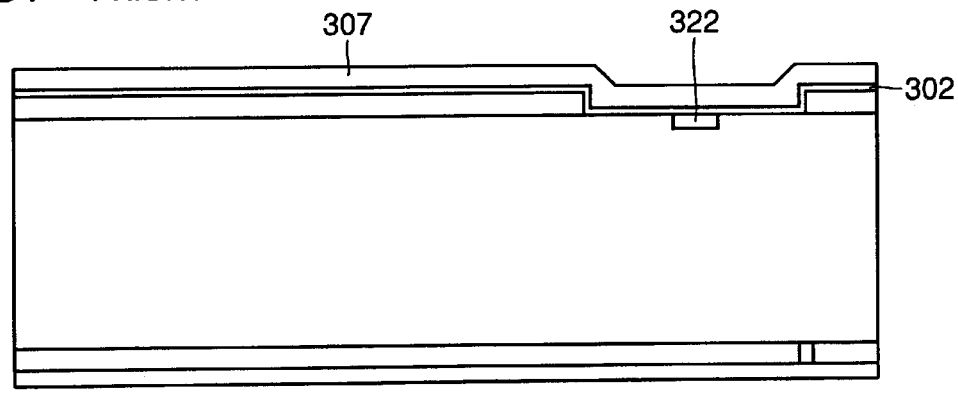
Figure 32:
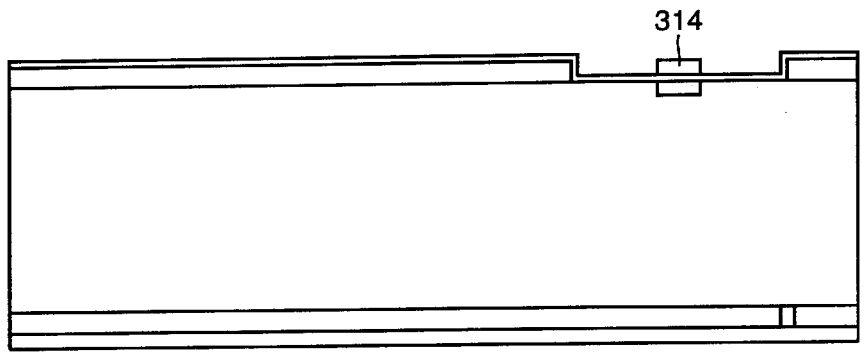
Figure 33:
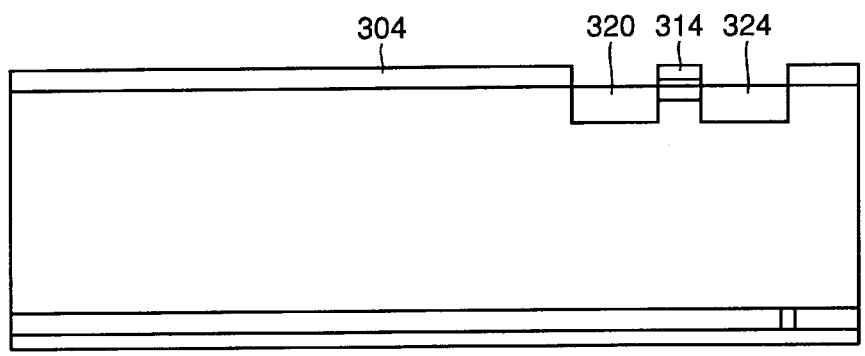
Figure 34:
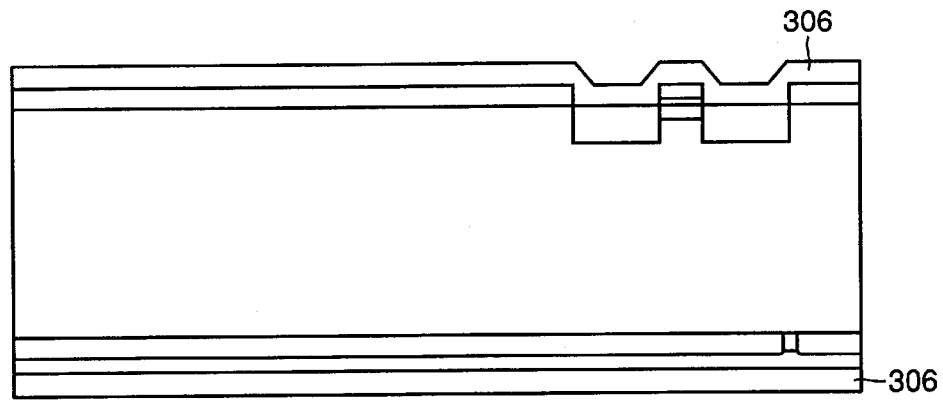
Figure 35:
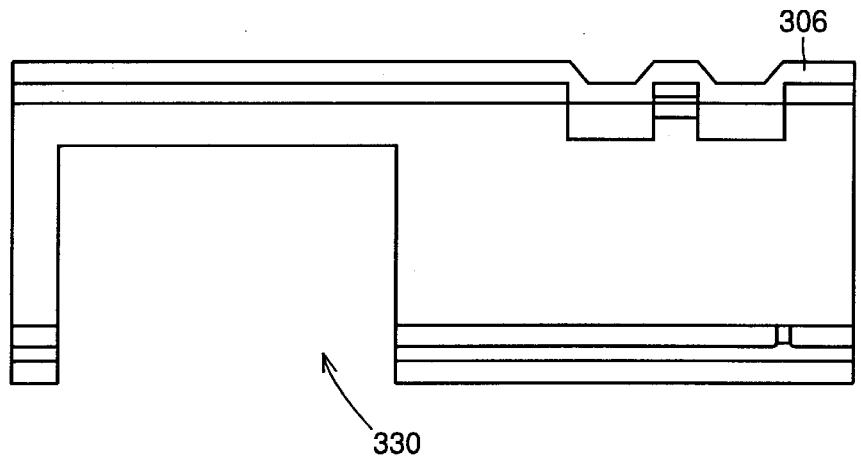
Figure 36:
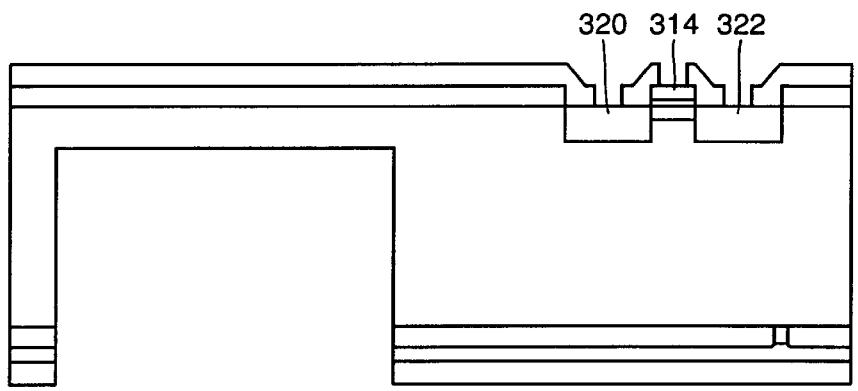
Figure 37:
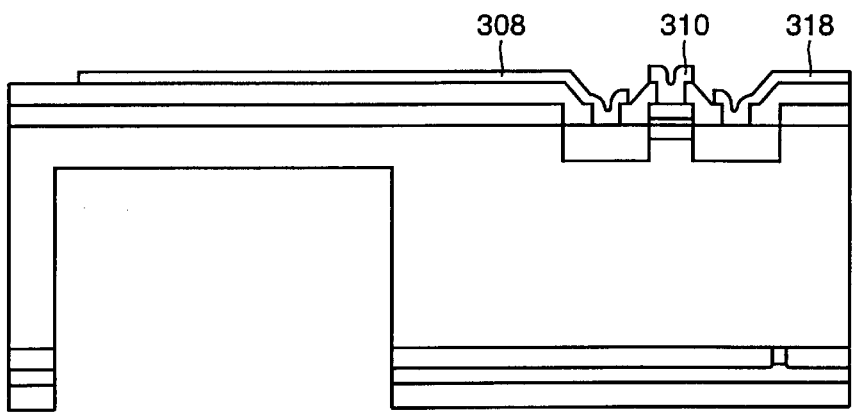
Figure 38:
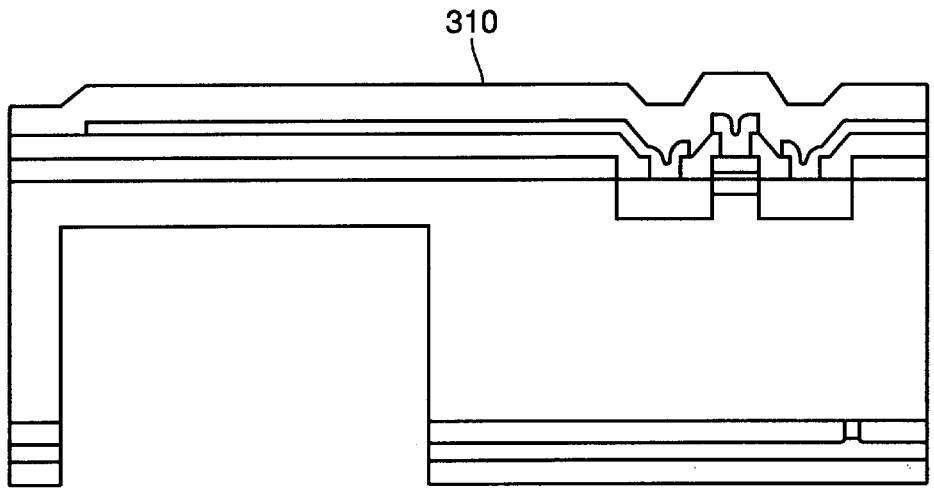
Figure 39:
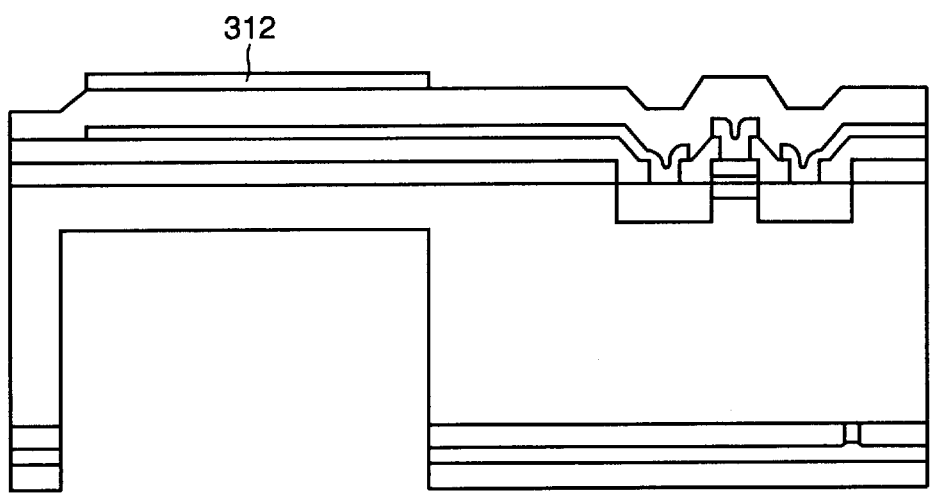

Referring to FIGS. 3 and 4, pixel cell 20 is different from the conventional infrared detecting element shown in FIG. 27 in that the former has a trench 330 which is opened from the rear side of an Si substrate 300 to the portion directly under infrared detecting capacitor CF. Further, as discussed later, the shape of infrared detecting capacitor CF and trench 330 is different in plan view from that of the conventional element.

Other details are similar to those of the structure shown in FIG. 27. Therefore, the same components are denoted by the same reference character and description thereof is not repeated here.

Referring to FIG. 3, the region GV represents a plane pattern for forming trench 330 by etching. The region GES surrounding region GV represents an area where an etching stopper layer is formed which is used when trench 330 is made by etching from the rear side. Specifically, as mentioned above, ions of boron (B) or the like (e.g. $3 \times 10^{16}$ cm$^{-3}$ in concentration) are implanted from the front side of the substrate to lower the etching rate of Si and thus generate the etching stopper layer.

Referring further to FIG. 3, a pixel cell adjacent to the pixel cell 20 is formed in mirror symmetry with respect to the side S–S'.

The ferroelectric film of BST [$(Ba_{1-x}Sr_x) TiO_3$] is formed by laser ablation to a thickness of approximately 1 μm on a stacked structure of Pt/Ti/SiO$_2$ deposited on the Si substrate of (100) plane.

Depending on the composition Ba/Sr of BST, Curie temperature Tc considerably changes. When the composition is approximately 2 (x=0.33), Curie temperature Tc ranges from 25° C. to 30° C. causing a remarkable change in dielectric constant. When the rate of change is near the maximum, the rate reaches approximately 100/K (kelvin) which is converted into a relative amount of change of approximately 10%.

Figure 5:
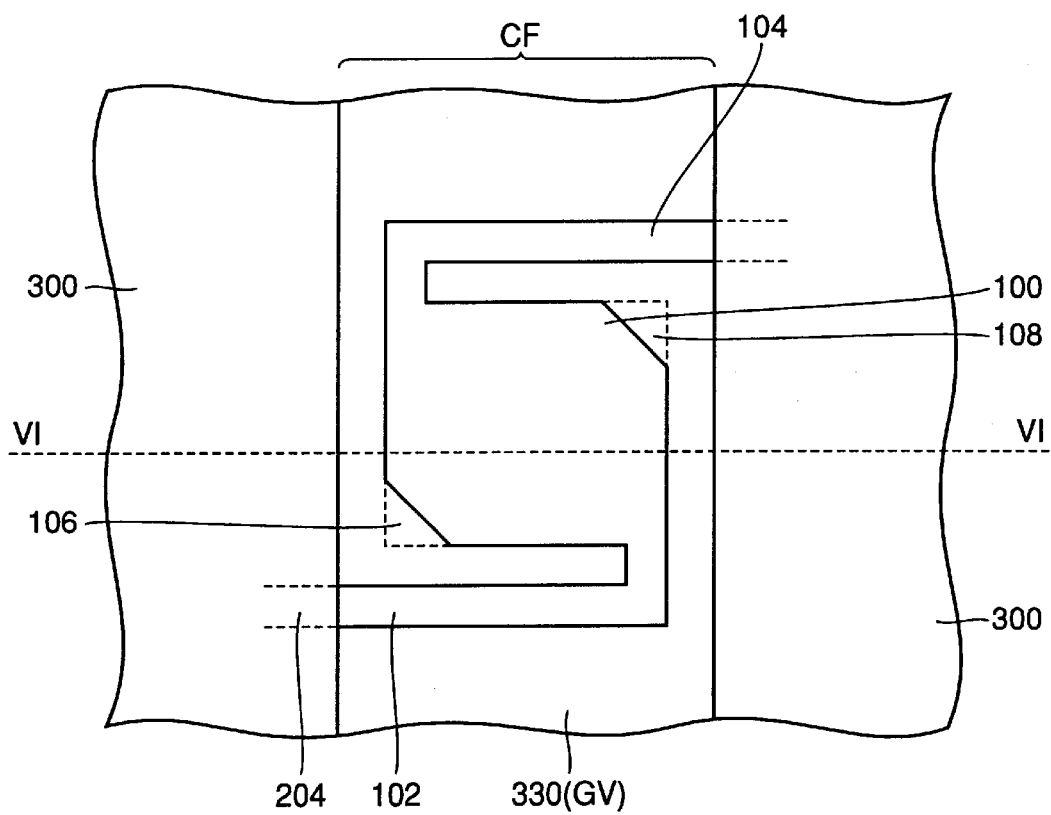
FIG. 5 shows a more detailed plane pattern of an infrared detecting capacitor CF and a trench 330 (GV) shown in FIG. 3.
Figure 6:
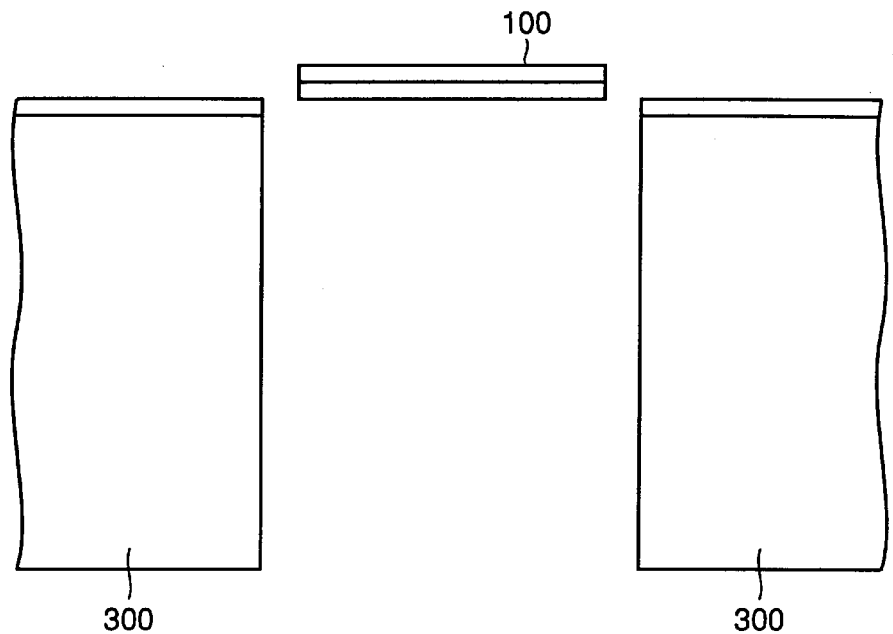
FIG. 6 is a cross sectional view along VI—VI in FIG. 5.

FIG. 5 shows a more detailed plane pattern of infrared detecting capacitor CF and trench 330 (GV) shown in FIG. 3. FIG. 6 is a cross sectional view along VI—VI in FIG. 5.

As shown in FIG. 5, infrared detecting capacitor CF includes a capacitor portion 100 which is suspended by interconnecting lines 102 and 104 on both sides of trench 330. Accordingly, capacitor portion 100 has a membrane structure as discussed above. For example, a lower electrode 308 is coupled to interconnecting line 102 and an upper electrode 312 is coupled to interconnecting line 104.

In plan view, capacitor portion 100 is a rectangle in shape without sections 106 and 108 opposite to each other in the diagonal direction (indicated by the dotted lines). Then, capacitor portion 100 is of polygonal shape in plan view having at least three pairs of opposing sides. This shape alleviates influences of stress in the stacked films of capacitor portion 100. As shown in FIG. 6, although there is no Si substrate directly under infrared detecting capacitor CF, the membrane potion is not distorted as observed in the conventional structure.

In other words, an increased range of allowable stress in the stacked films, the range being determined to prevent the membrane portion from distorting, makes it possible to achieve an infrared detecting element having a high sensitivity by means of a simplified process.

[Second Embodiment]

Figure 7:
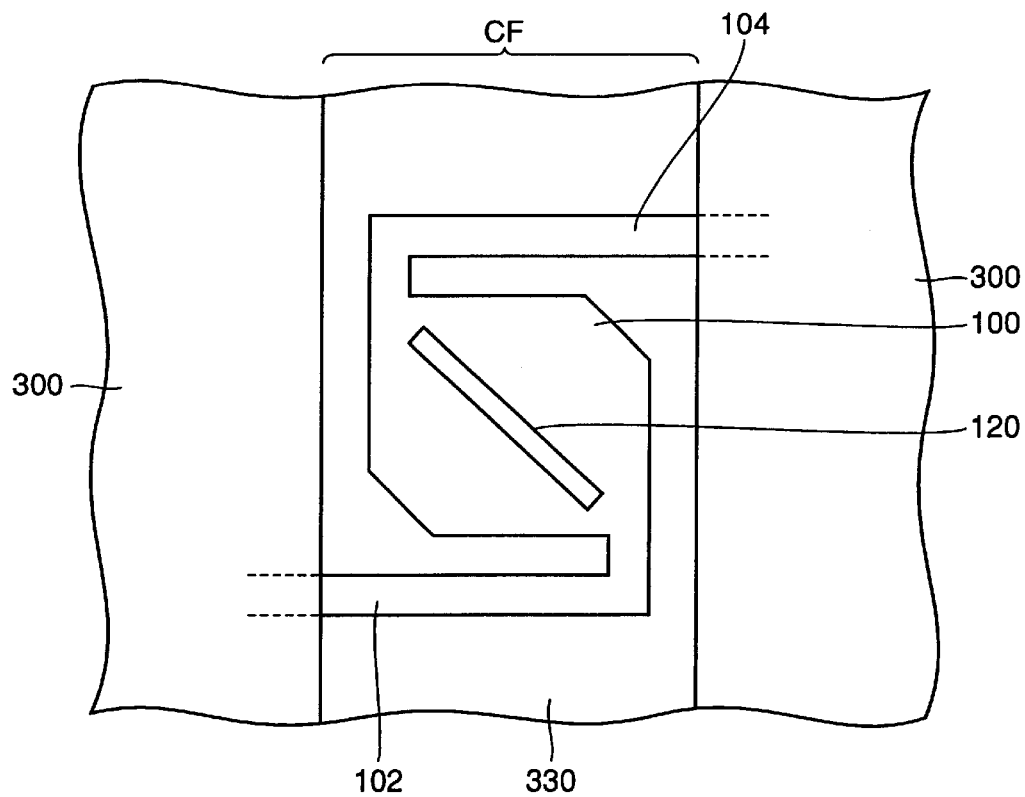
FIG. 7 shows a more detailed plane pattern of an infrared detecting capacitor CF and a trench 330 (GV) according to a second embodiment.

FIG. 7 shows a more detailed plane pattern of an infrared detecting capacitor CF and a trench 330 (GV) according to a second embodiment, to be compared with FIG. 5 of the first embodiment.

The structure of infrared detecting capacitor CF shown in FIG. 7 is different from that of the first embodiment in that the former has a slit 120 in the central part of a capacitor portion (membrane) 100.

Specifically, a through hole is formed in this slit 120 which contributes to a further prevention of distortion due to the stress of stacked films.

Accordingly, an increased range of allowable stress in the stacked films makes it possible to achieve an infrared detecting element having a high sensitivity by means of a simplified process.

[Third Embodiment]

Figure 8:
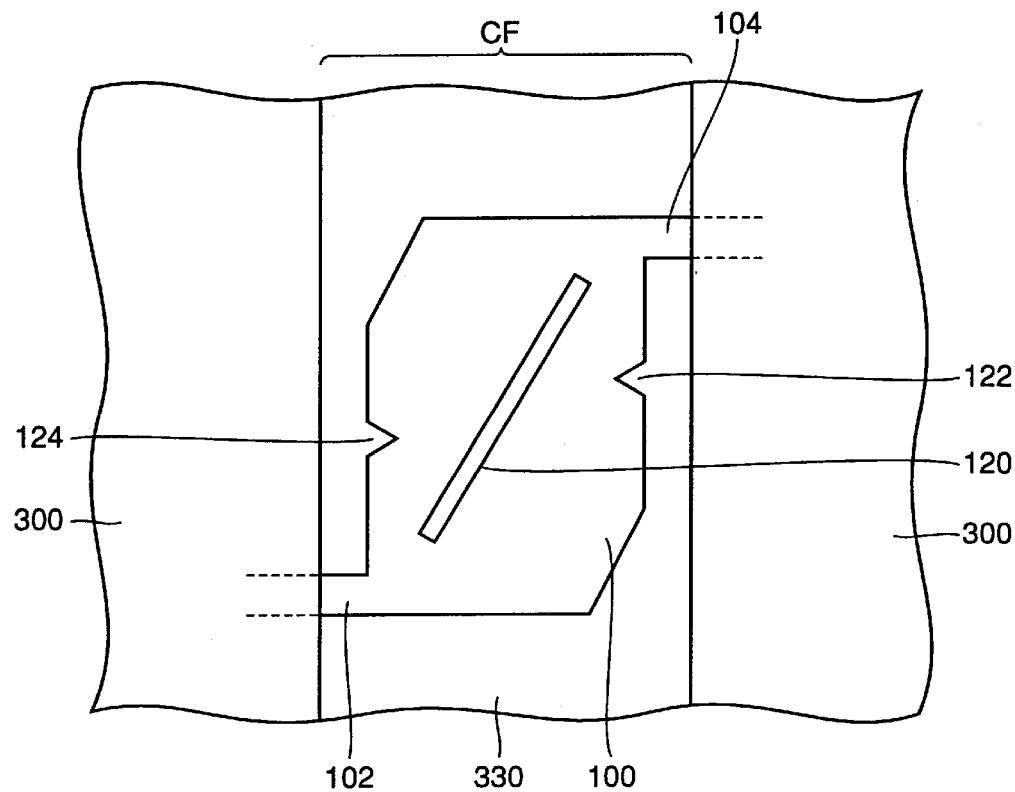
FIG. 8 shows a more detailed plane pattern of an infrared detecting capacitor CF and a trench 330 (GV) according to a third embodiment.

FIG. 8 shows a more detailed plane pattern of an infrared detecting capacitor CF and a trench 330 (GV) according to a third embodiment, to be compared with FIG. 7 of the second embodiment.

The structure in FIG. 8 differs from that in FIG. 7 in that interconnecting lines 102 and 104 respectively support a capacitor portion 100 at vertex portions closer to an Si substrate 300 and in that cuts 120 and 122 are made in the vicinity of the supported portions.

This structure can also prevent the distortion of the membrane portion due to the stress of stacked films as the second embodiment.

[Fourth Embodiment]

According to the first to third embodiments explained above, Si substrate 300 beneath infrared detecting capacitor CF is completely removed by etching the substrate from the rear side.

However, Si substrate 300 may not necessarily be etched from the rear side to make trench 330, if the sensitivity of the infrared detecting element is to be enhanced by reducing as much as possible a thermal loss to Si substrate 300 having a high thermal conductivity.

Accordingly, an infrared detecting element of a fourth embodiment has a feature that an Si substrate 300 beneath an infrared detecting capacitor CF is removed through etching from the front side of the substrate.

Figure 40:
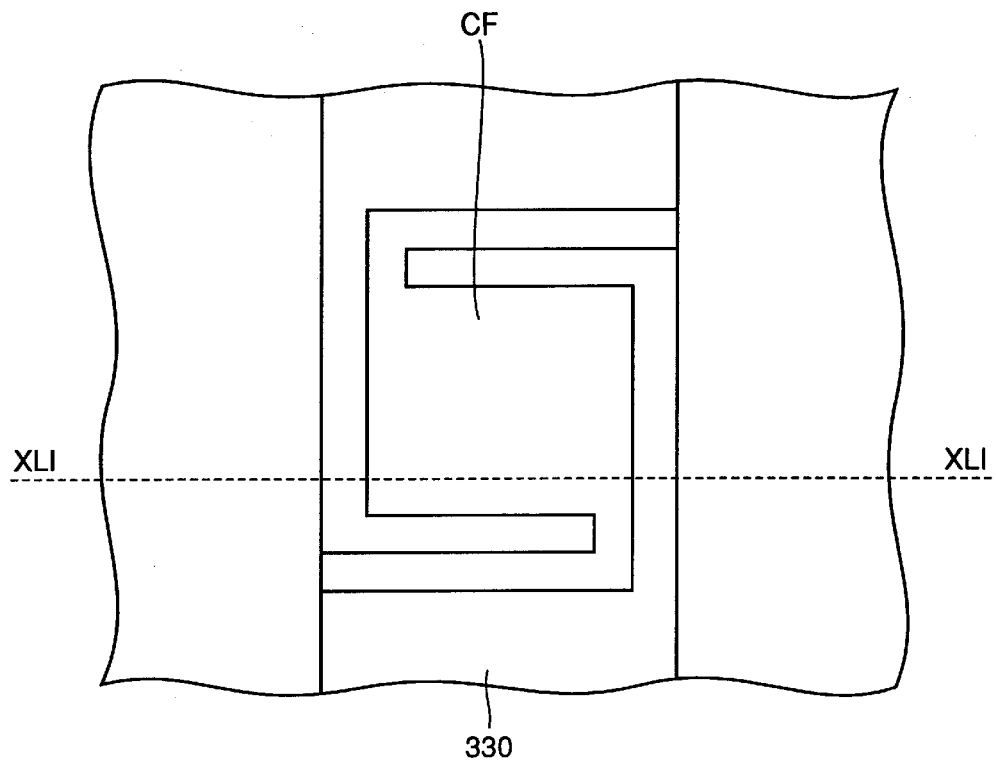
FIG. 40 is a plan view showing a state where an Si substrate directly under an infrared detecting capacitor CF is completely etched away to the thickness of 0 μm.
Figure 41:
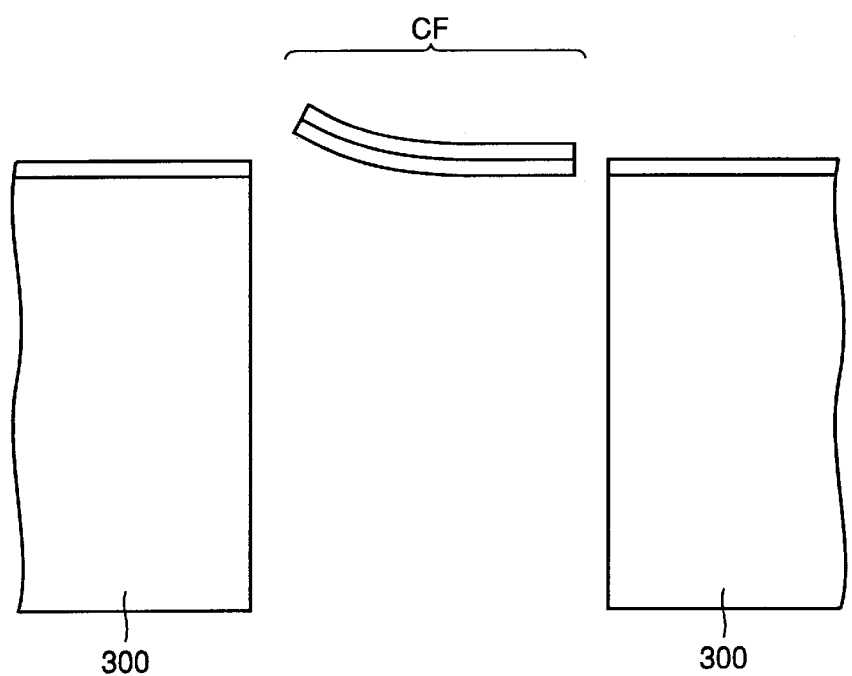
FIG. 41 is a cross sectional view along XLI—XLI in FIG. 40.

In this case, the shape of infrared detecting capacitor CF in plan view may be that of the conventional plane pattern of infrared detecting capacitor CF described in conjunction with FIG. 40 or that according to the first to the third embodiments. If the shape in plan view of the first to third embodiments described above is employed, the effect of preventing the distortion of the membrane structure is synergistically exhibited.

If a slit 120 is provided at the central portion of capacitor 100 as the second and third embodiments, a further effect that etching from the front side of Si substrate 300 beneath infrared detecting capacitor CF is promoted.

This structure can shorten the period in which Si substrate 300 is immersed in etchant for etching thereof, so that prevention is possible of deterioration in the quality of a ferroelectric film, as clearly seen from the discussion below.

Figure 9:
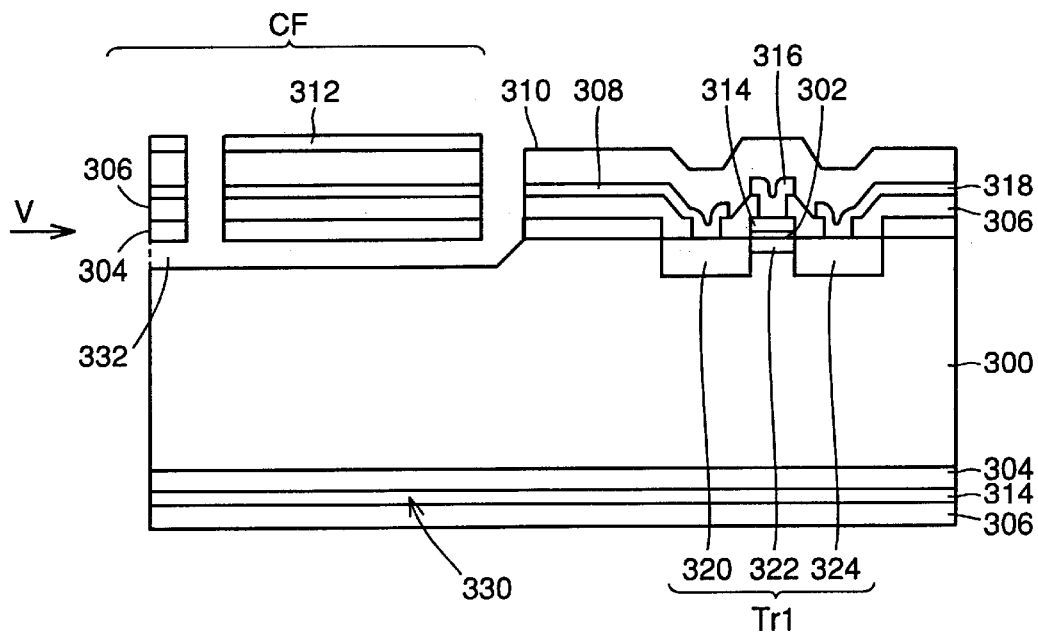
FIG. 9 shows a cross sectional structure of an infrared detecting capacitor CF according to a fourth embodiment.

FIG. 9 shows a cross sectional structure of infrared detecting capacitor CF according to the fourth embodiment, to be compared with FIG. 4 of the first embodiment.

The fourth embodiment is similar to the first embodiment except that a trench 332 is formed from the front side of Si substrate 300 in the fourth embodiment. Therefore, the same components are denoted by the same reference character and description thereof is not repeated.

A method of manufacturing the structure shown in FIG. 9 is described following a flow of manufacture in conjunction with cross sections viewed in the direction indicated by the arrow V in FIG. 9.

Figure 10A:
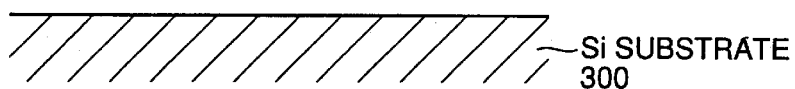
FIGS. 10A to 10C are cross sectional views showing a flow of first to third process steps of manufacturing the structure shown in FIG. 9.
Figure 10B:
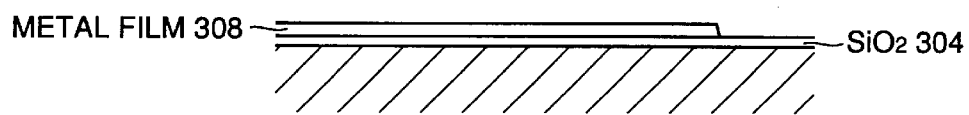
Figure 10C:
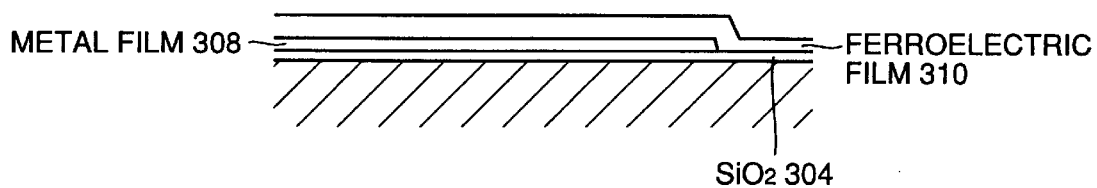

FIGS. 10A to 10C are cross sectional views showing a flow of first to third process steps of manufacturing the structure shown in FIG. 9.

Namely, only the flow of forming infrared detecting capacitor CF is described below for avoiding complexity in description, without description of a manufacturing process of the transistor portion.

On a surface of Si substrate 300 shown in FIG. 10A, a silicon oxide film (SiO$_2$ film) 304 is formed by thermal oxidation like the conventional one as shown in FIG. 10B. A metal film 308, for example, a stacked Pt/Ti film that constitutes a lower electrode is formed thereon by RF sputtering and lift-off as the conventional method.

Referring to FIG. 10C, laser ablation or the like method is used to deposit a ferroelectric thin film 310 such as BST film.

Figure 11A:
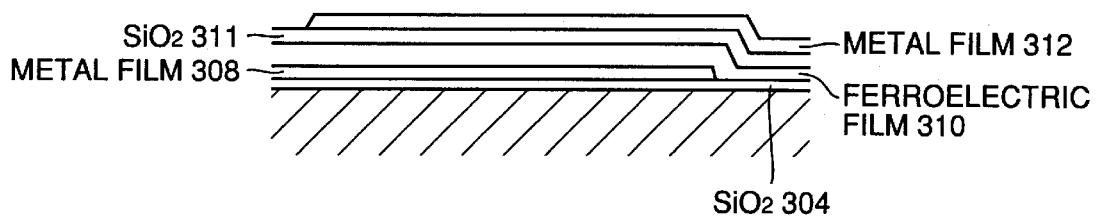
FIGS. 11A to 11C are cross sectional views showing a flow of fourth to sixth steps of the manufacturing method of the structure shown in FIG. 9.
Figure 11B:
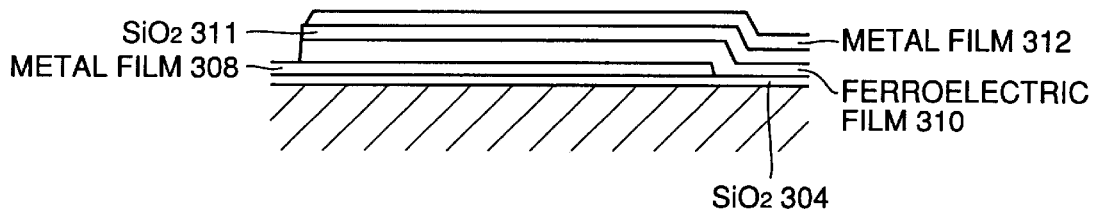
Figure 11C:
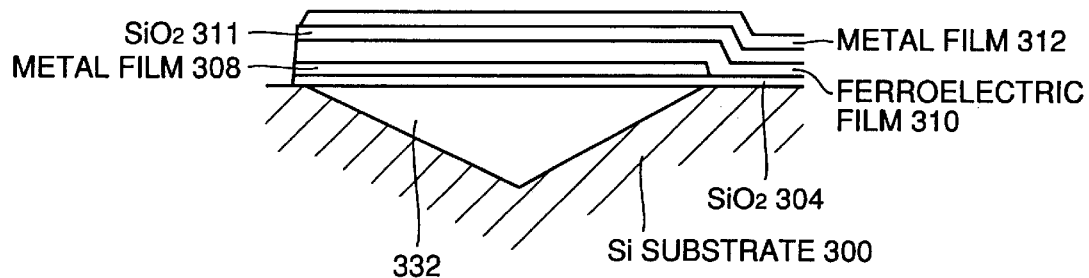

FIGS. 11A to 11C are cross sectional views showing a flow of fourth to sixth steps of the manufacturing method of the structure shown in FIG. 9.

As shown in FIG. 11A, a silicon oxide film (SiO$_2$ film) 311 is formed by means of CVD or the like on ferroelectric film 310. A metal film 312 which constitutes an upper electrode, for example, Al film is formed thereon by vacuum evaporation and lift-off.

Referring to FIG. 11B, upper electrode metal film 312 is used as a mask to etch away silicon oxide film 311 and ferroelectric film 310.

Referring to FIG. 11C, a resist pattern having an opening in an area corresponding to the GV region in FIG. 3 is formed on the surface of the Si substrate, the substrate is etched from the front side to remove the portion of the Si substrate beneath infrared detecting capacitor CF so that trench 332 is formed.

The etching here is performed by anisotropic wet etching with etchant of 22% TMAH at 100° C. for a predetermined period, and trench 332 is thus formed in Si substrate 300 beneath infrared detecting capacitor CF.

Through these process steps, Si substrate 300 is eliminated in the portion beneath infrared detecting capacitor CF to prevent deterioration of the ferroelectric film and thus make it possible to improve the sensitivity of the infrared detecting element.

Additionally, as the silicon oxide film is deposited by CVD on ferroelectric film 310, the stress of ferroelectric film 310 is alleviated to advantageously reduce distortion of the membrane portion.

[First Modification of Fourth Embodiment]

Figure 12A:
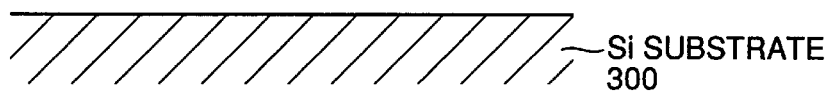
FIGS. 12A to 12C are cross sectional views, according to a first modification of a manufacturing method of the fourth embodiment, showing a flow of first to third steps thereof.
Figure 12B:
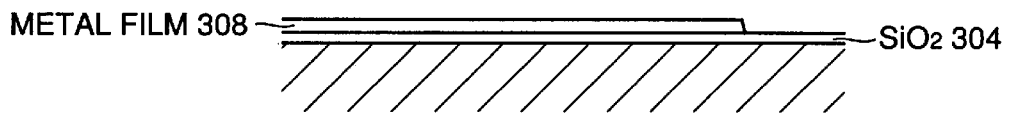
Figure 12C:
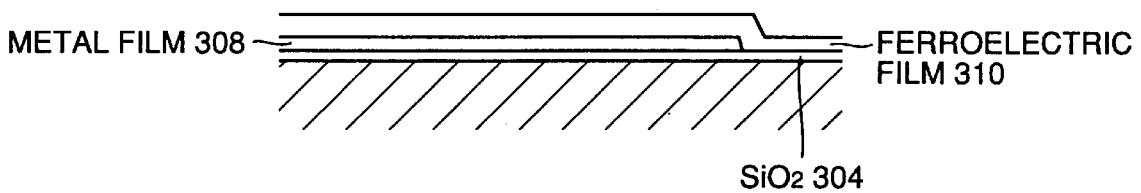
Figure 13A:
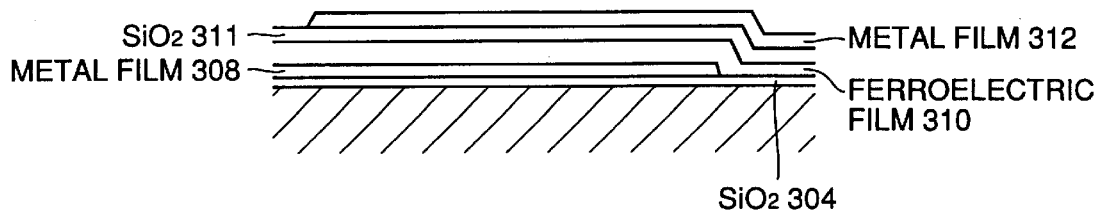
FIGS. 13A to 13C are cross sectional views showing a flow of fourth to sixth steps of the manufacturing method according to the first modification of the fourth embodiment.
Figure 13B:
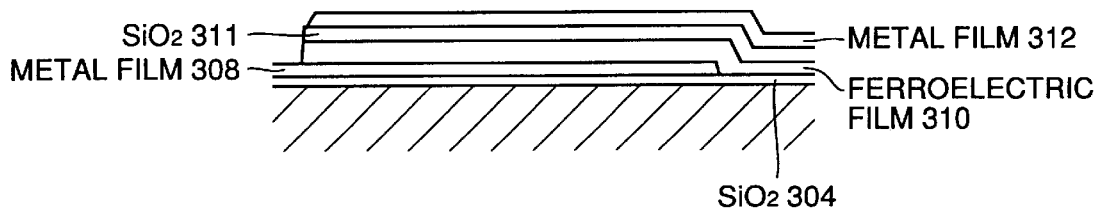
Figure 13C:
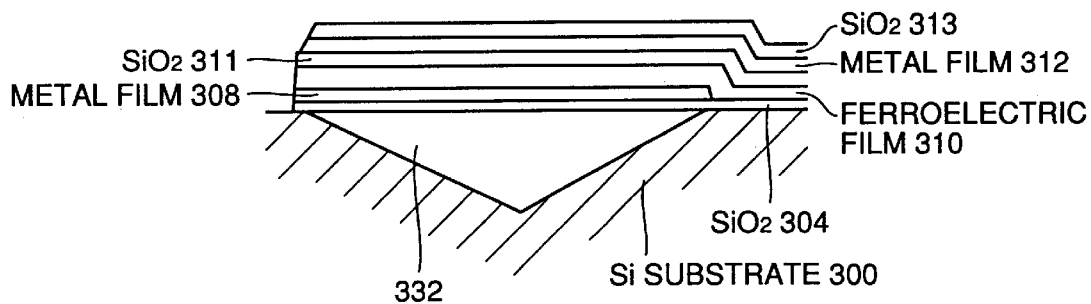

FIGS. 12A to 12C are cross sectional views, according to a first modification of the manufacturing method of the fourth embodiment, showing a flow of first to third steps of a manufacturing method of the structure shown in FIG. 9. FIGS. 13A to 13C are cross sectional views showing a flow of fourth to sixth steps of the manufacturing method according to the first modification of the fourth embodiment.

The first modification differs from the fourth embodiment in that upper electrode metal film 312 is used as a mask to etch away the silicon oxide film and the ferroelectric film in the fifth step shown in FIG. 13B and thereafter a silicon oxide film 313 is formed thereon by CVD and patterned, and then Si substrate 300 is etched beneath infrared detecting capacitor CF from the front side in the sixth step shown in FIG. 13C.

By this manufacturing method, silicon oxide film 313 is further produced by CVD in the uppermost layer of the stacked structure in the membrane portion. Consequently, the entire stress is alleviated to further reduce distortion of the membrane portion.

An additional effect is an enhanced sensitivity since silicon oxide film 313 formed by CVD serves as an infrared absorbing film. A silicon nitride film (SiN film) or SOG (spin on glass) film may be used as such an infrared absorbing film to achieve a similar effect.

[Second Modification of Fourth Embodiment]

Figure 14A:
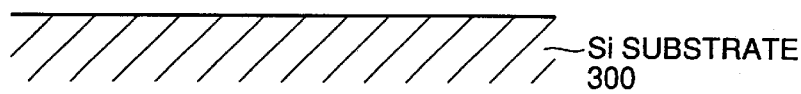
FIGS. 14A to 14C are cross sectional views, according to a second modification of the manufacturing method of the fourth embodiment, showing a flow of first to third steps thereof.
Figure 14B:
Figure 14C:
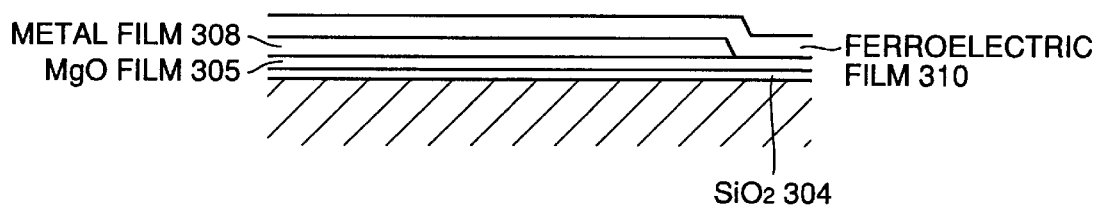
Figure 15A:
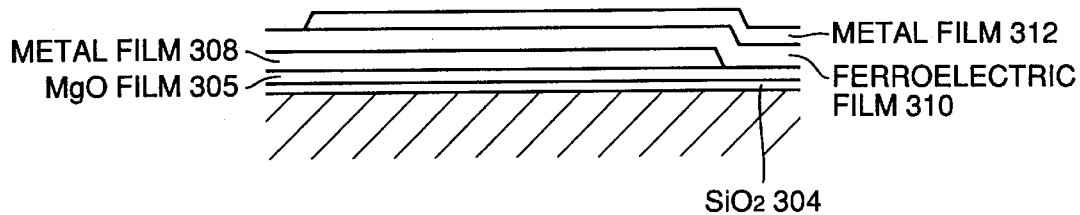
FIGS. 15A to 15C are cross sectional views showing a flow of fourth to sixth steps of the manufacturing method according to the second modification of the fourth embodiment.
Figure 15B:
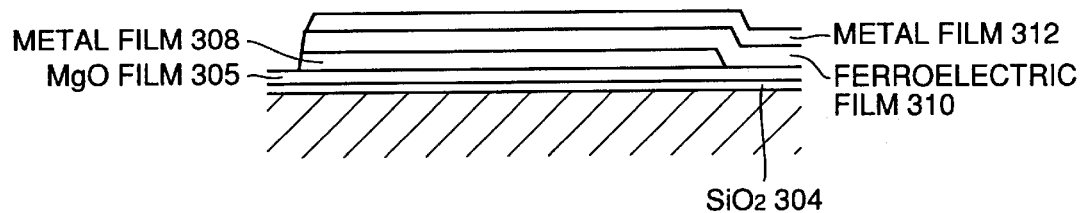
Figure 15C:
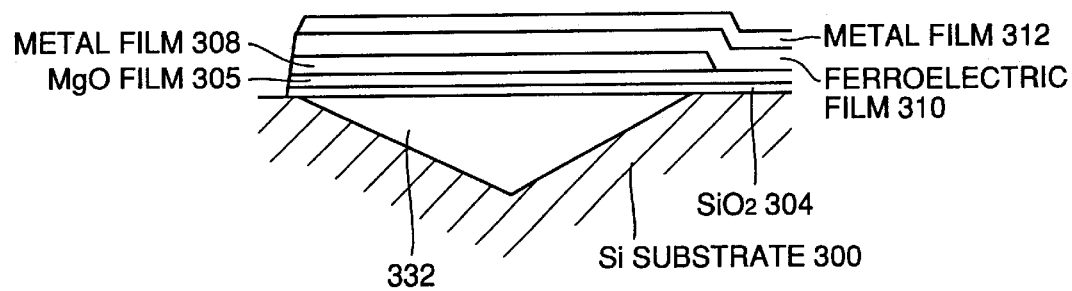

FIGS. 14A to 14C are cross sectional views, according to a second modification of the manufacturing method of the fourth embodiment, showing a flow of first to third steps of a manufacturing method of the structure shown in FIG. 9. FIGS. 15A to 15C are cross sectional views showing a flow of fourth to sixth steps of the manufacturing method according to the second modification of the fourth embodiment.

The manufacturing method of the second modification is different from that of the fourth embodiment in that an MgO film 305 is further formed on the silicon oxide film on Si substrate 300 in the second step shown in FIG. 14B and no silicon oxide film 311 is formed on ferroelectric film 310.

The MgO film is formed by means of sputtering using MgO as a target with oxygen at a flow rate of 20 sccm and Ar at a flow rate of 50 sccm, a gas pressure of 1 Pa and an RF power of 200 W.

Other details are basically similar to those of the manufacturing method of the fourth embodiment and description thereof is not repeated.

According to the manufacturing method of the second modification, MgO film 305 is formed to be included in the stacked structure of the membrane portion. Resultant effects are alleviation of the entire stress and further reduction of the distortion in the membrane portion.

In addition, the orientation of the ferroelectric film is improved and thus characteristics thereof are enhanced, providing a higher sensitivity.

[Third Modification of Fourth Embodiment]

Figure 16A:
FIGS. 16A to 16C are cross sectional views, according to a third modification of the manufacturing method of the fourth embodiment, showing a flow of first to third steps thereof.
Figure 16B:
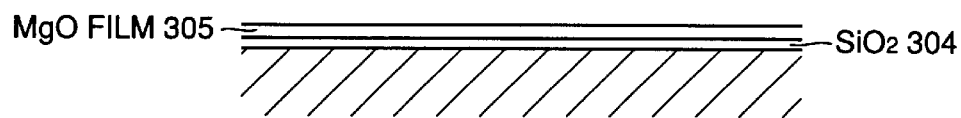
Figure 16C:
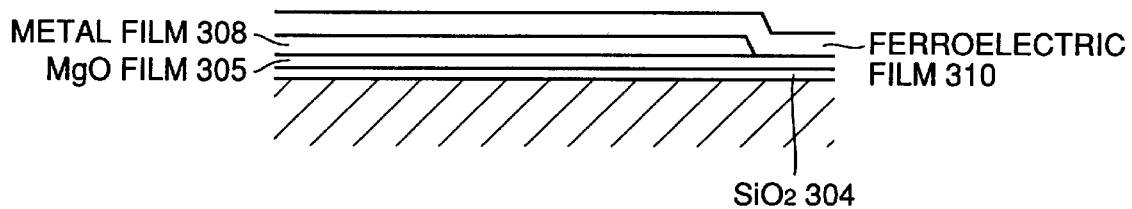
Figure 17A:
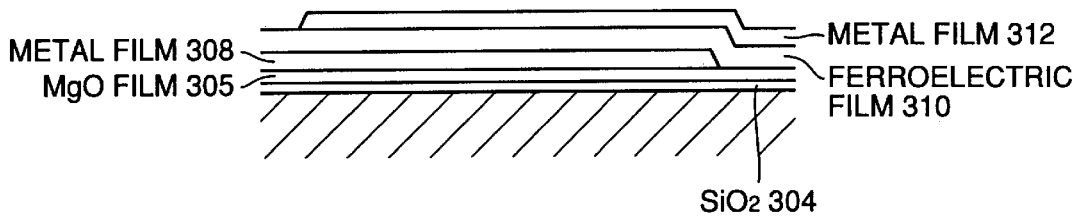
FIGS. 17A to 17C are cross sectional views showing a flow of fourth to sixth steps of the manufacturing method according to the third modification of the fourth embodiment.
Figure 17B:
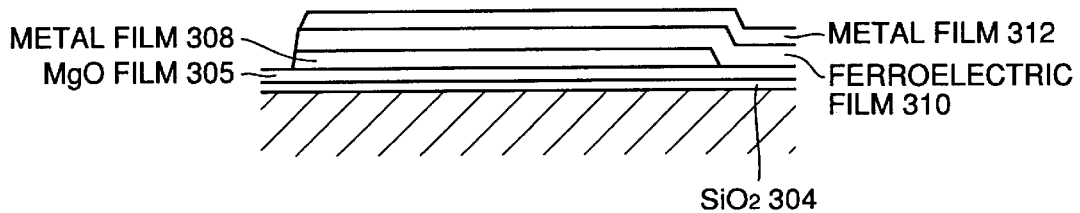
Figure 17C:
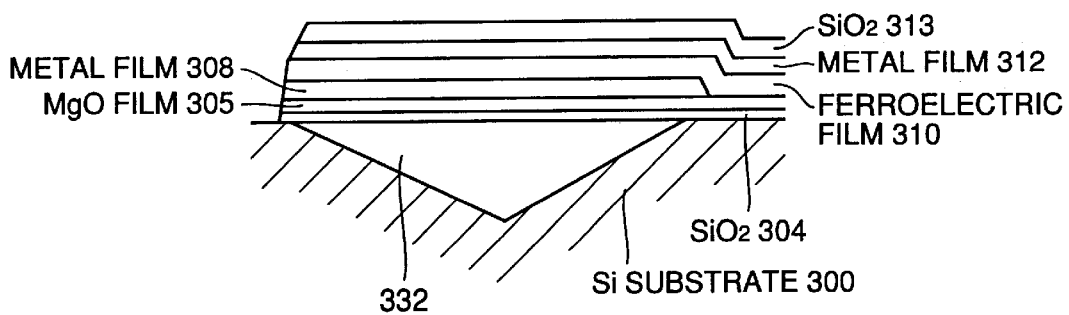

FIGS. 16A to 16C are cross sectional views, according to a third modification of the manufacturing method of the fourth embodiment, showing a flow of first to third steps of a manufacturing method of the structure shown in FIG. 9. FIGS. 17A to 17C are cross sectional views showing a flow of fourth to sixth steps of the manufacturing method according to the third modification of the fourth embodiment.

The manufacturing method of the third modification differs from that of the fourth embodiment in that an MgO film 305 is further formed on the silicon oxide film on Si substrate 300 in the second step shown in FIG. 16B and no silicon oxide film 311 is formed on ferroelectric film 310.

Additionally, the method differs from that of the fourth embodiment in that, after upper metal electrode 312 is used as a mask to etch ferroelectric film 310 in the fifth step shown in FIG. 17B, a silicon oxide film is further formed thereon by CVD and patterned and then Si substrate 300 beneath infrared detecting capacitor CF is etched from the front side of the substrate in the sixth step shown in FIG. 17C.

Other details are basically similar to those of the manufacturing method of the fourth embodiment and description thereof is not repeated.

According to the manufacturing method described above, the entire stress of the membrane portion is alleviated to further reduce distortion of the membrane portion.

In addition, the silicon oxide film serves as a protection film to prevent the ferroelectric film from deteriorating. A silicon nitride film (SiN film) or SOG (spin on glass) film may be used as such a protection film to achieve a similar effect.

[Fifth Embodiment]

According to the fourth embodiment, the ferroelectric film is formed and then the infrared detecting capacitor CF is completed, and thereafter the Si substrate directly under infrared detecting capacitor CF is removed to generate the structure as shown in FIG. 9.

By the manufacturing method of the fourth embodiment, the ferroelectric film is immersed in etchant of the Si substrate for a remarkably reduced time while the influence of the etchant cannot be avoided completely.

According to a manufacturing method of a fifth embodiment, it is possible to perfectly prevent deterioration of the ferroelectric film due to etchant of the Si substrate and thus produce the structure shown in FIG. 9. It is noted that the fifth embodiment is similar to the fourth embodiment except for the method of manufacturing the infrared detecting capacitor CF.

Figure 18A:
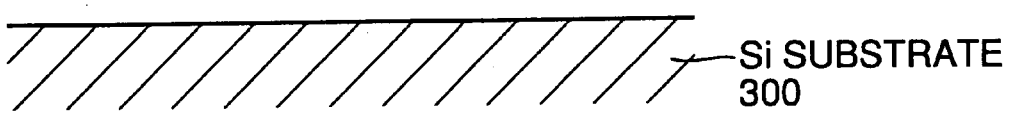
FIGS. 18A to 18C are cross sectional views showing a flow of first to third process steps of manufacturing the structure shown in FIG. 9, according to a fifth embodiment.
Figure 18B:
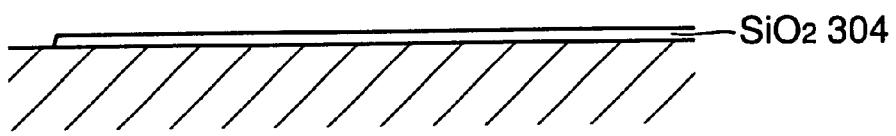
Figure 18C:
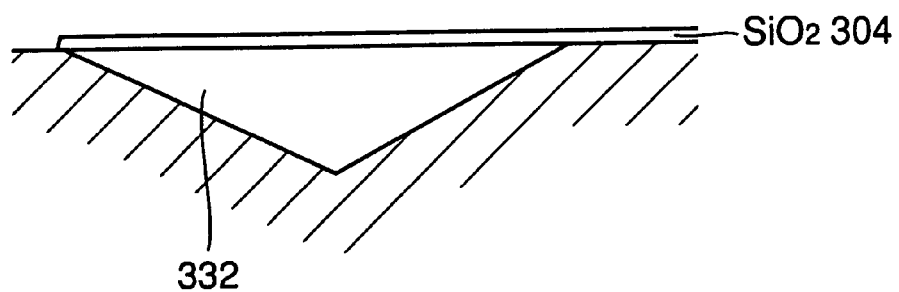

FIGS. 18A to 18C are cross sectional views showing a flow of first to third steps of a manufacturing method of the structure shown in FIG. 9, according to the fifth embodiment.

It is noted that the following description does not include explanation of a manufacturing process of the transistor portion for avoiding complexity in description and only a flow of forming infrared detecting capacitor CF is described.

On an Si substrate 300 as shown in FIG. 18A, a silicon oxide film 304 is formed by thermal oxidation like the conventional method as shown in FIG. 18B.

A resist pattern having an opening in an area corresponding to the GV region in FIG. 3 is formed on a surface of the Si substrate, silicon oxide film 304 and silicon substrate 300 are etched from the front side, and then the Si substrate beneath the region where infrared detecting capacitor CF is formed is removed in advance to produce a trench 332.

Figure 19A:
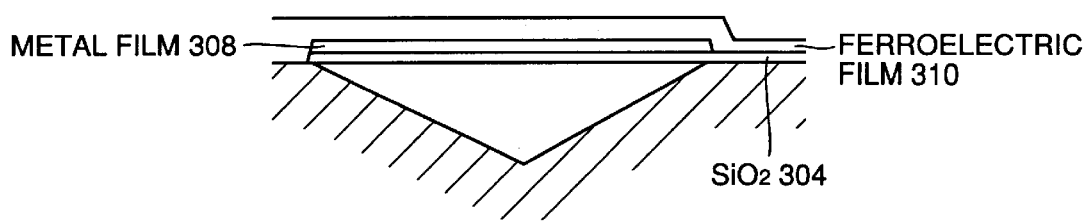
FIGS. 19A and 19B are cross sectional views showing a flow of fourth and fifth steps of the manufacturing method of the fifth embodiment.
Figure 19B:
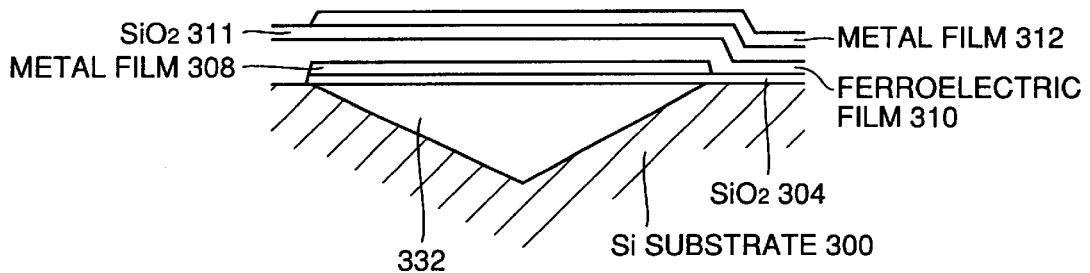

FIGS. 19A and 19B are cross sectional views showing a flow of fourth and fifth steps of the manufacturing method according to the fifth embodiment.

Referring to FIG. 19A, a metal film 308 constituting a lower electrode, for example, a stacked Pt/Ti film is formed on silicon oxide film 304 by RF sputtering and lift-off as the conventional method. Laser ablation is thereafter used to deposit a ferroelectric thin film 310 such as BST film.

Referring to FIG. 19B, a silicon oxide film ($SiO_2$ film) 311 is formed by CVD or the like on the ferroelectric film. A metal film 312 constituting an upper electrode, for example, Al film is formed thereon by vacuum evaporation and lift-off.

The process steps as discussed above can be used to remove Si substrate 300 directly under infrared detecting capacitor CF from the front side and improve the sensitivity of the infrared detecting element without deterioration of the ferroelectric film.

[First Modification of Fifth Embodiment]

Figure 20A:
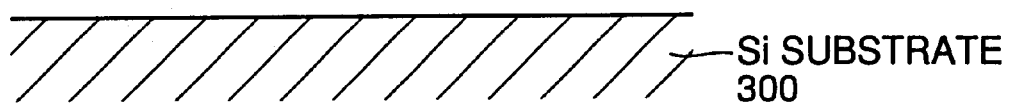
FIGS. 20A to 20C are cross sectional views, according to a first modification of the manufacturing method of the fifth embodiment, showing a flow of first to third steps thereof.
Figure 20B:
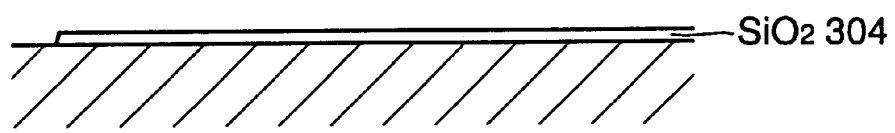
Figure 20C:
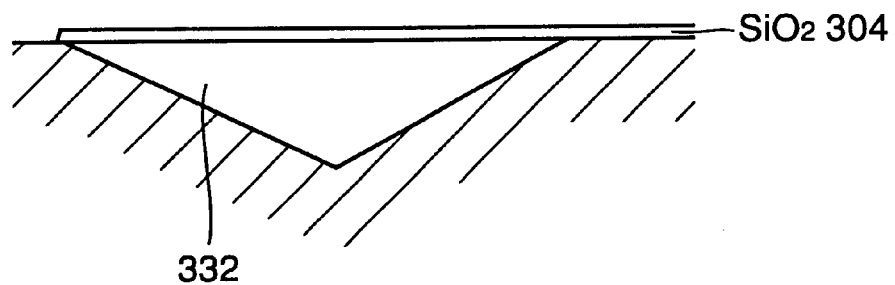
Figure 21A:
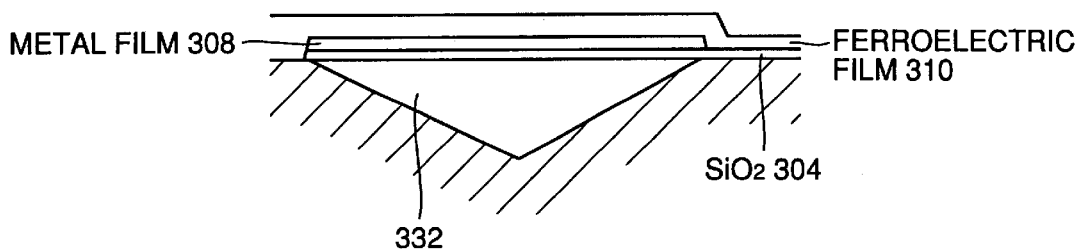
FIGS. 21A and 21B are cross sectional views showing a flow of fourth and fifth steps of the manufacturing method according to the first modification of the fifth embodiment.
Figure 21B:
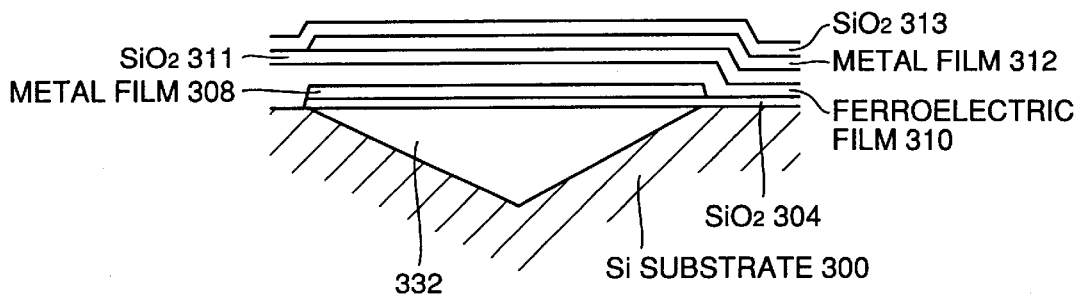

FIGS. 20A to 20C are cross sectional views, according to a first modification of the manufacturing method of the fifth embodiment, showing a flow of first to third steps of a manufacturing method of the structure shown in FIG. 9. FIGS. 21A and 21B are cross sectional views showing a flow of fourth and fifth steps of the manufacturing method according to the first modification of the fifth embodiment.

The first modification differs from the fifth embodiment in that a silicon oxide film 313 is further formed by CVD on the upper metal electrode in the fifth step shown in FIG. 21B.

By this manufacturing method, silicon oxide film 313 is further produced by CVD in the uppermost layer of the stacked structure in the membrane portion. Consequently, the entire stress is alleviated to further reduce distortion of the membrane portion.

An additional effect is an enhanced sensitivity since silicon oxide film 313 formed by CVD serves as an infrared absorbing film. An organic macromolecular film may be used as such an infrared absorbing film to achieve a similar effect.

[Second Modification of Fifth Embodiment]

Figure 22A:
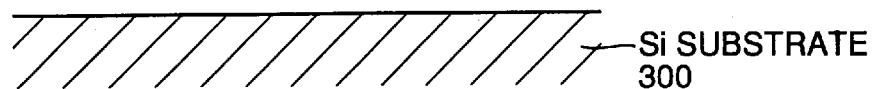
FIGS. 22A to 22C are cross sectional views, according to a second modification of the manufacturing method of the fifth embodiment, showing a flow of first to third steps thereof.
Figure 22B:
Figure 22C:
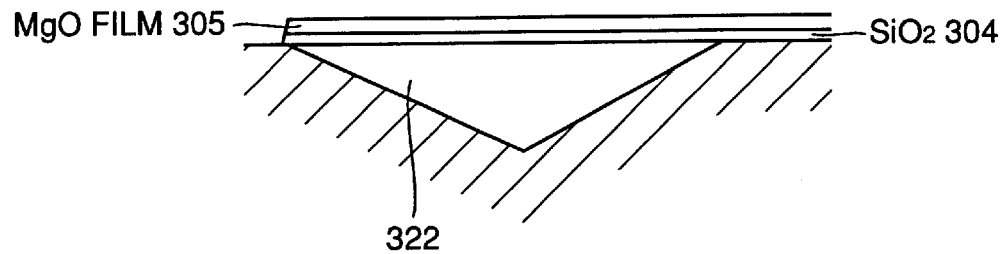
Figure 23A:
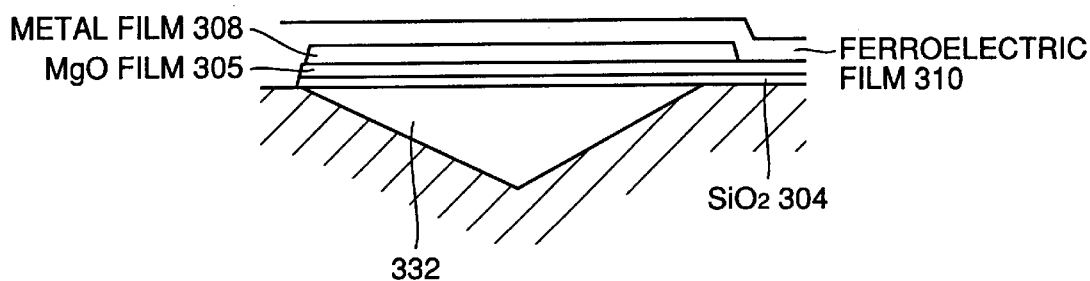
FIGS. 23A and 23B are cross sectional views showing a flow of fourth and fifth steps of the manufacturing method according to the second modification of the fifth embodiment.
Figure 23B:
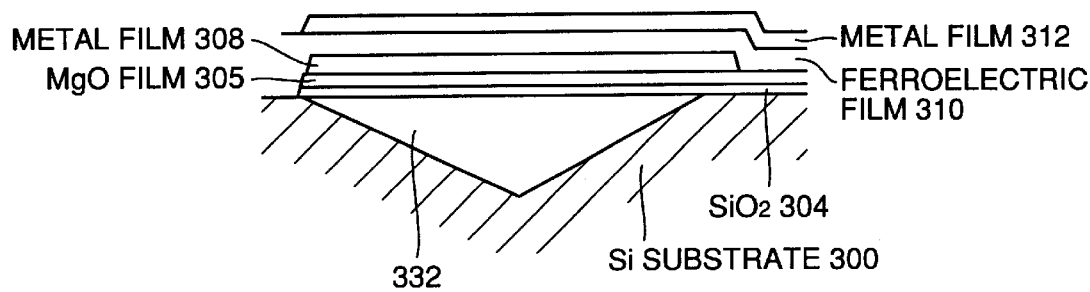

FIGS. 22A to 22C are cross sectional views, according to a second modification of the manufacturing method of the fifth embodiment, showing a flow of first to third steps of a manufacturing method of the structure shown in FIG. 9. FIGS. 23A and 23B are cross sectional views showing a flow of fourth and fifth steps of the manufacturing method according to the second modification of the fifth embodiment.

The manufacturing method of the second modification is different from that of the fifth embodiment in that an MgO film is further formed on the silicon oxide film on Si substrate 300 in the second step shown in FIG. 22B and no silicon oxide film 311 is formed on ferroelectric film 310.

The MgO film is formed under the same conditions as those of the fourth embodiment.

Other details are basically similar to those of the manufacturing method of the fifth embodiment and description thereof is not repeated.

According to the manufacturing method of the second modification, the MgO film is formed to be included in the stacked structure of the membrane portion. Resultant effects are alleviation of the entire stress and further reduction of the distortion in the membrane portion.

An additional effect is an enhanced sensitivity since silicon oxide film 313 formed by CVD serves as an infrared absorbing film. An organic macromolecular film may be used as such an infrared absorbing film to achieve a similar effect.

[Third Modification of Fifth Embodiment]

Figure 24A:
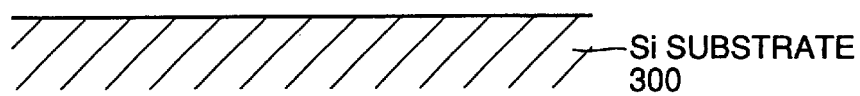
FIGS. 24A to 24C are cross sectional views, according to a third modification of the manufacturing method of the fifth embodiment, showing a flow of first to third steps thereof.
Figure 24B:
Figure 24C:
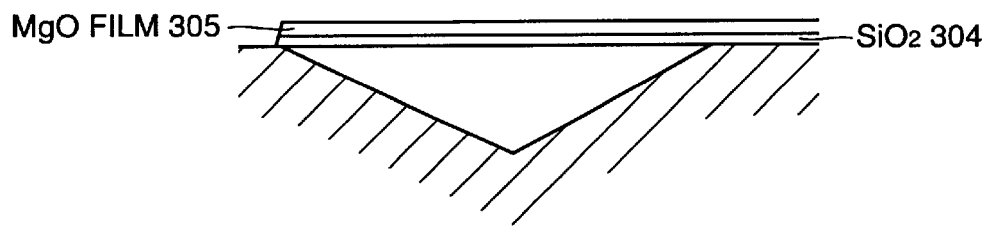
Figure 25A:
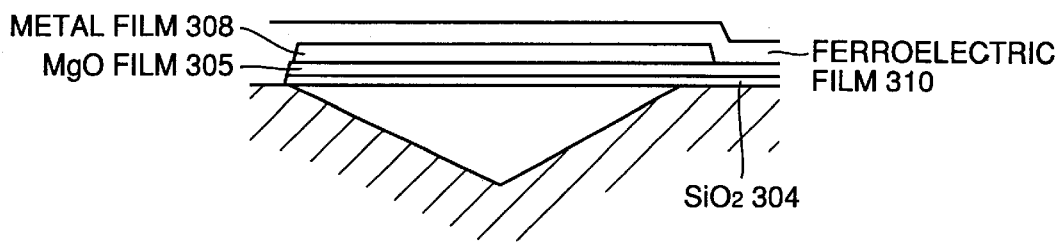
FIGS. 25A and 25B are cross sectional views showing a flow of fourth and fifth steps of the manufacturing method according to the third modification of the fifth embodiment.
Figure 25B:
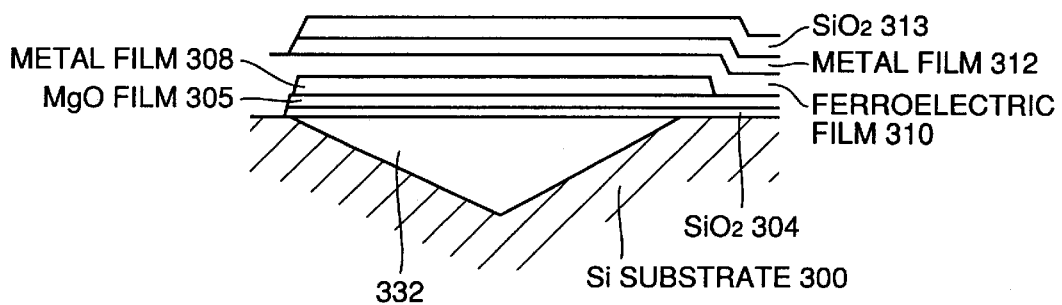
Figure 26:
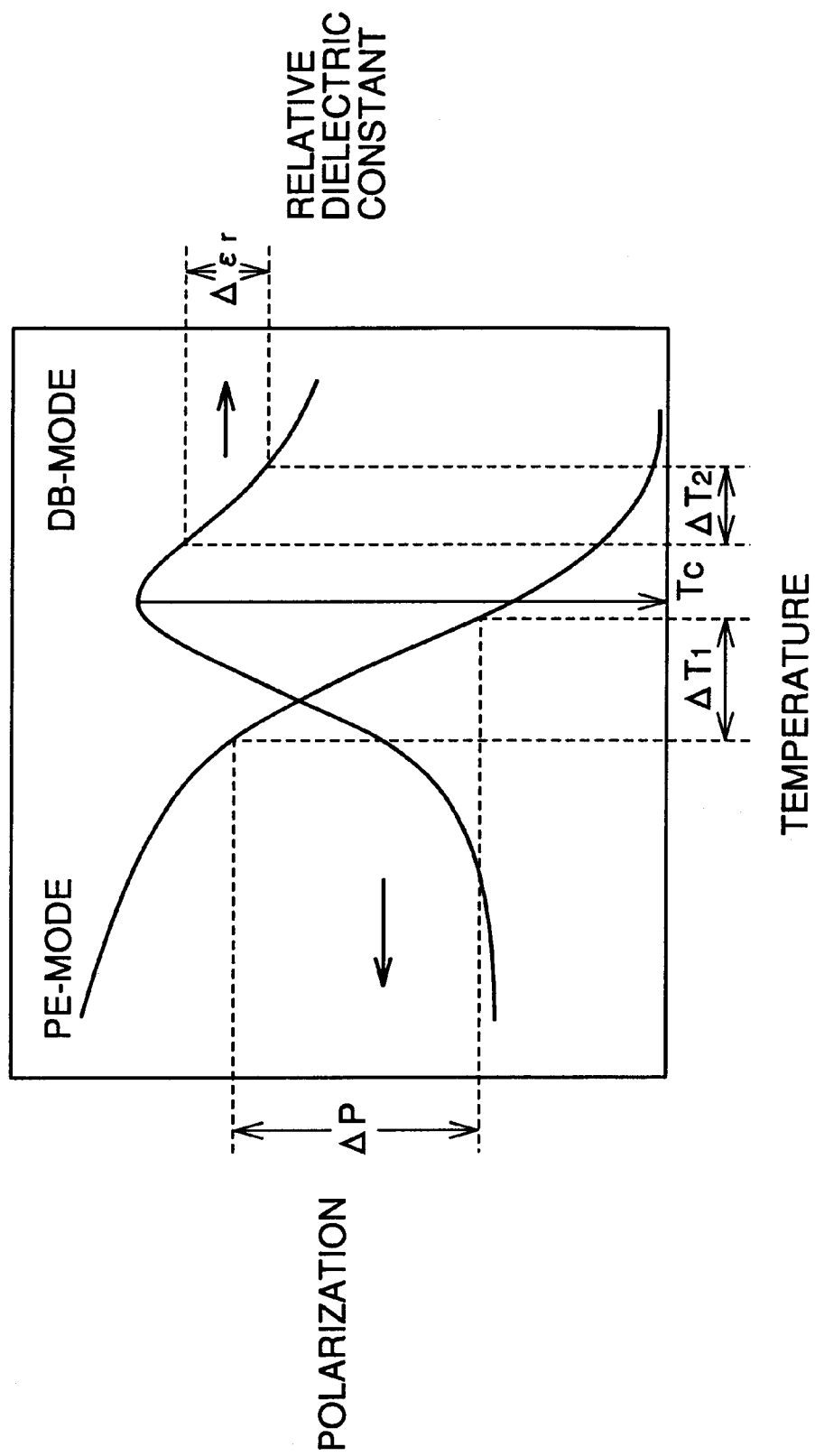
FIG. 26 shows respective temperature dependencies of polarization and dielectric constant.

FIGS. 24A to 24C are cross sectional views, according to a third modification of the manufacturing method of the fifth embodiment, showing a flow of first to third steps of a manufacturing method of the structure shown in FIG. 9. FIGS. 25A and 25B are cross sectional views showing a flow of fourth and fifth steps of the manufacturing method according to the third modification of the fifth embodiment.

The manufacturing method of the third modification differs from that of the fifth embodiment in that an MgO film is further formed on the silicon oxide film on Si substrate 300 in the second step shown in FIG. 24B and no silicon oxide film 311 is formed on ferroelectric film 310.

Additionally, the method differs from that of the fifth embodiment in that, a silicon oxide film 313 is further formed by CVD on the upper metal electrode in the fifth step shown in FIG. 25B.

Other details are basically similar to those of the manufacturing method of the fifth embodiment and description thereof is not repeated.

According to the manufacturing method described above, the entire stress of the membrane portion is alleviated to further reduce distortion of the membrane portion.

Pixel cells structured as heretofore described can be used to achieve an infrared detecting circuit of a simple structure having a high sensitivity at room temperature. A two-dimensional sensor array having such pixel cells arranged in two dimension can be used to achieve an infrared two-dimensional image sensor operating at room temperature with a high sensitivity and highly dense pixels.

Moreover, the infrared detecting circuit and the infrared two-dimensional image sensor according to the present invention as described above implement an infrared image sensor of a small size capable of operating at room temperature, so that a thermography can be obtained with a simple structure.

Applications over a wide range are thus possible including not only indoor uses like early diagnosis of diseases, fault diagnosis of machines and instruments, and gas leakage detection but also outdoor uses like city and natural environment monitoring, fire watching, driving assistant in a dark field for automobile, nondestructive diagnosis of buildings, intrusion alarm, resource exploration, weather observation, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an infrared detecting element comprising the steps of:
   forming on a main surface of a substrate a first interconnecting line and a lower electrode metal layer;
   forming a ferroelectric layer on said lower electrode metal layer;
   depositing a first insulating film of silicon oxide on said ferroelectric layer;
   forming on said first insulating film an upper electrode metal layer and a second interconnecting line;
   anisotropically wet etching said substrate beneath said lower electrode metal layer from said main surface of said substrate to form a trench such that said lower electrode metal layer, said ferroeletric layer and said upper electrode metal layer are supported by said first and second interconnecting lines.

2. The method of manufacturing an infrared detecting element according to claim 1, further comprising the step of depositing a second insulating film after said step of forming said upper electrode metal layer and said second interconnecting line.

3. A method of manufacturing an infrared detecting element comprising the steps of:
   forming an MgO film on a main surface of a substrate;
   forming on said MgO film a first interconnecting line and a lower electrode metal layer;
   forming a ferroelectric layer on said lower electrode metal layer;
   forming on said ferroelectric layer an upper electrode metal layer and a second interconnecting line; and
   anisotropically wet etching said substrate beneath said lower electrode metal layer from said main surface of said substrate to form a trench such that said lower electrode metal layer, said ferroelectric layer and said upper electrode metal layer are supported by said first and second interconnecting lines.

4. The method of manufacturing an infrared detecting element according to claim 3, further comprising the step of depositing an insulating film after said step of forming said upper electrode metal layer and said second interconnecting line.

5. A method of manufacturing an infrared detecting element comprising the steps of:
   depositing a first insulating film on a main surface of a substrate and patterning said first insulating film into a shape including a predetermined shape in plan view;
   anisotropically wet etching said substrate beneath said predetermined shape of said first insulating film from said main surface of said substrate to form a trench such that said predetermined shape constitutes a membrane supported with respect to the main surface of said substrate;
   forming a first interconnecting line and a lower electrode metal layer for said membrane;
   forming a ferroelectric layer on said lower electrode metal layer;
   depositing a second insulating film of silicon oxide on said ferroelectric layer; and
   forming on said second insulating film an upper electrode metal layer and a second interconnecting line.

6. The method of manufacturing an infrared detecting element according to claim 5, further comprising the step of depositing a third insulating film after said step of forming said upper electrode metal layer and said second interconnecting line.

7. A method of manufacturing an infrared detecting element comprising the steps of:
   depositing a first insulating film on a main surface of a substrate;
   forming an MgO film on said first insulating film and patterning said first insulating film and said MgO film into a shape including a predetermined shape in plan view;
   anisotropically wet etching said substrate beneath said predetermined shape of said first insulating film from said main surface of said substrate to form a trench such that said predetermined shape constitutes a membrane supported with respect to the main surface of said substrate;
   forming a first interconnecting line and a lower electrode metal layer on said membrane;
   forming a ferroelectric layer on said lower electrode metal layer; and
   forming on said ferroelectric layer an upper electrode metal layer and a second interconnecting line.

8. The method of manufacturing an infrared detecting element according to claim 7, further comprising the step of depositing a second insulating film after said step of forming said upper electrode metal layer and said second interconnecting line.

* * * * *